(12) United States Patent
Park et al.

(10) Patent No.: US 12,229,369 B2
(45) Date of Patent: Feb. 18, 2025

(54) ELECTRONIC DEVICE CAPABLE OF DETERMINING PLACEMENT INTO A POCKET AND METHOD OF DRIVING ELECTRONIC DEVICE

(71) Applicant: SAMSUNG DISPLAY CO., LTD., Yongin-si (KR)

(72) Inventors: So-Young Park, Yongin-si (KR); Soongyu Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/449,858

(22) Filed: Aug. 15, 2023

(65) Prior Publication Data
US 2024/0176447 A1    May 30, 2024

(30) Foreign Application Priority Data
Nov. 24, 2022    (KR) ........................ 10-2022-0159724

(51) Int. Cl.
*G06F 3/041*    (2006.01)
*G06F 3/044*    (2006.01)
(Continued)

(52) U.S. Cl.
CPC ...... *G06F 3/041662* (2019.05); *G06F 3/0445* (2019.05); *G06F 3/0446* (2019.05); *G09G 3/2096* (2013.01); *G06F 3/0412* (2013.01); *G06F 3/0416* (2013.01); *G06F 3/04164* (2019.05); *G06F 3/04166* (2019.05); *G06F 2203/04111* (2013.01);
(Continued)

(58) Field of Classification Search
CPC ............. G06F 3/041662; G06F 3/0446; G06F 3/0412; G06F 3/04166; G06F 3/04164; G06F 3/0445; G06F 3/0416; G06F 2203/04111; G06F 2203/04112; G09G 3/2096; G09G 2300/0842; G09G 2330/022; G09G 3/20; G09G 3/3233; G09G 2330/045; G09G 3/3208; G09G 2360/014
See application file for complete search history.

(56) References Cited

U.S. PATENT DOCUMENTS 9,983,656 B2    5/2018    Merrell et al.
10,420,031 B2    9/2019    Alameh et al.
(Continued)

FOREIGN PATENT DOCUMENTS

KR    10-2020-0101265    8/2020

*Primary Examiner* — Adam J Snyder
(74) *Attorney, Agent, or Firm* — F. Chau & Associates, LLC

(57) ABSTRACT

An electronic device includes a display layer including a pixel within an active region and a sensor, a sensor layer, a display driving circuit, a sensor driving circuit, and a main driving circuit to operate in a first mode. In the first mode, the display driving circuit emits a first light through a light emitting element of the pixel disposed in a first region of the active region, the display driving circuit receives a second light reflected based on the first light, through a sensing element of the sensor disposed in the first region and a second region surrounding the first region, and the main driving circuit determines whether the display layer and the sensor layer are placed in a pocket of a user, based on an amount of the second light.

22 Claims, 25 Drawing Sheets

(51) Int. Cl.
  *G09G 3/20*      (2006.01)
  *G09G 3/3208*    (2016.01)
  *G09G 3/3233*    (2016.01)
  *H10K 50/844*    (2023.01)
  *H10K 59/40*     (2023.01)

(52) U.S. Cl.
  CPC ...... *G06F 2203/04112* (2013.01); *G09G 3/20* (2013.01); *G09G 3/3208* (2013.01); *G09G 3/3233* (2013.01); *G09G 2300/0842* (2013.01); *G09G 2330/022* (2013.01); *G09G 2330/045* (2013.01); *G09G 2360/14* (2013.01); *H10K 50/844* (2023.02); *H10K 59/40* (2023.02)

(56) References Cited

U.S. PATENT DOCUMENTS

| | | | |
|---|---|---|---|
| 2016/0366639 A1* | 12/2016 | Alameh | H04W 52/0254 |
| 2017/0131829 A1* | 5/2017 | Takahashi | G06F 3/04182 |
| 2018/0322831 A1* | 11/2018 | Kim | G09G 3/3266 |
| 2019/0114458 A1* | 4/2019 | Cho | G09G 3/20 |
| 2019/0130155 A1* | 5/2019 | Park | G09G 3/32 |
| 2019/0294310 A1* | 9/2019 | Lee | G06F 3/04184 |
| 2019/0347987 A1* | 11/2019 | Zhao | G09G 3/3225 |
| 2020/0082143 A1* | 3/2020 | Yang | G06F 3/041 |
| 2020/0371666 A1* | 11/2020 | Ni | G06F 3/0488 |
| 2021/0158751 A1* | 5/2021 | Cha | G09G 3/3233 |
| 2021/0303098 A1* | 9/2021 | Shimada | G06F 3/044 |

\* cited by examiner

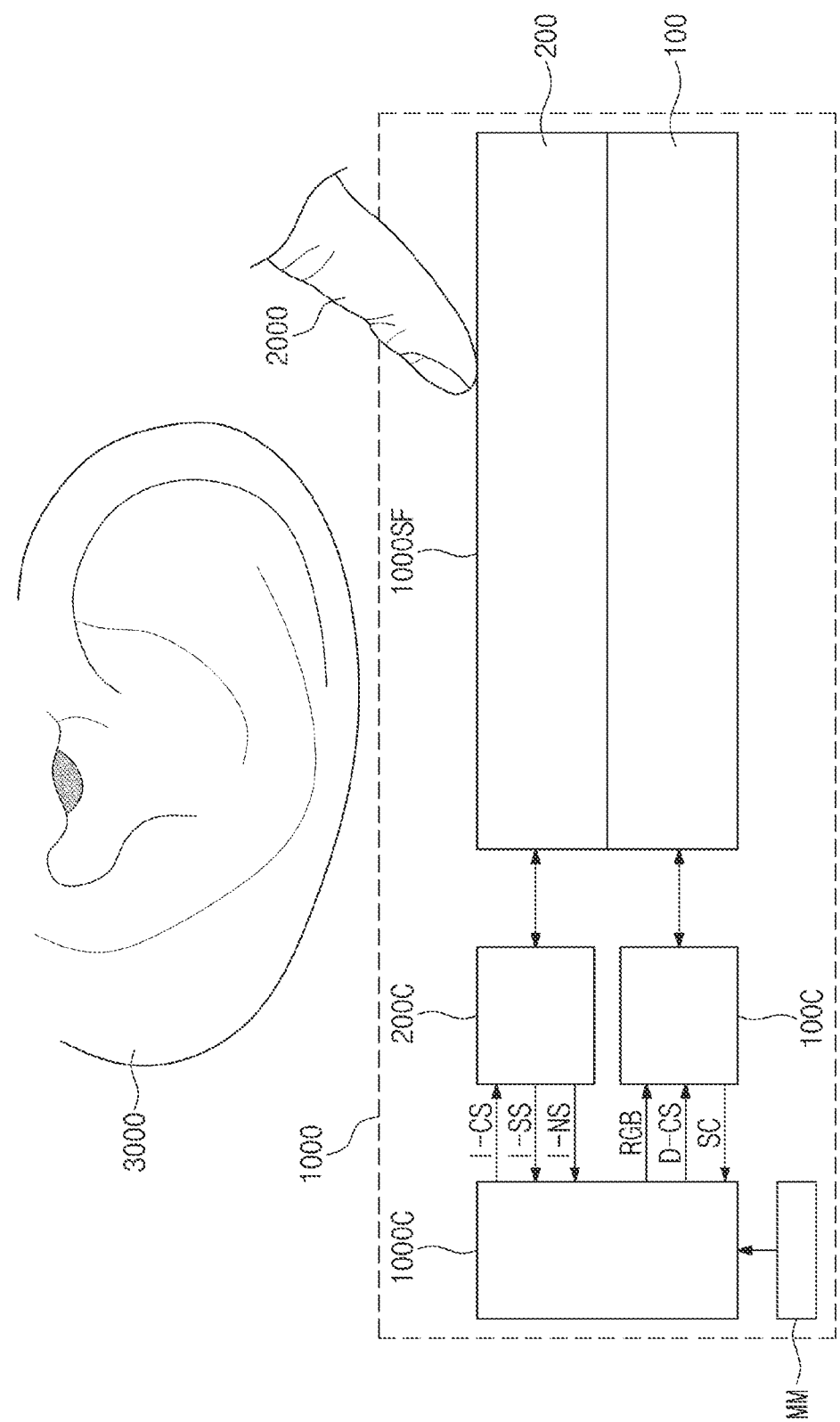

ELECTRONIC DEVICE CAPABLE OF DETERMINING PLACEMENT INTO A POCKET AND METHOD OF DRIVING ELECTRONIC DEVICE

CROSS-REFERENCE TO RELATED APPLICATIONS

This patent application claims priority under 35 U.S.C. § 119 to Korean Patent Application No. 10-2022-0159724 filed on Nov. 24, 2022, in the Korean Intellectual Property Office, the disclosure of which is incorporated by reference in its entirety herein.

1. Technical Field

Embodiments of the present disclosure described herein relate to an electronic device and a method for driving the electronic device.

2. Discussion of Related Art

Multimedia electronic devices, such as a television (TV), a cellular phone, a tablet computer, a navigation system, and a game console, includes a display device for displaying an input and a battery for providing power. The display device may include an input sensor that provides a touch-based input for enabling a user to input information or a command. When the electronic device is placed into a pocket of a user (e.g., pants pocket, shirt pocket, etc.), the display may continue to operate and drain power from the battery. Further, placement of the electronic device into the pocket may increase the temperature of the electronic device to a level that causes damage. Thus, there is a need for an electronic device capable of detecting whether it has been placed into the pocket.

SUMMARY

Embodiments of the present disclosure provide an electronic device and a method for driving the electronic device, capable of determining whether the electronic device is placed in a pocket of a user.

According to an embodiment, an electronic device include a display layer, a sensor layer, a display driving circuit, a sensor driving circuit, and a main driving circuit. The display layer includes a pixel within an active region to display an image and a sensor. The pixel includes a pixel driving circuit and a light emitting element. The sensor includes a sensor driving circuit and a sensing element. The sensor layer is disposed on the display layer and includes a plurality of first electrodes and a plurality of second electrodes. The display driving circuit controls the pixel and the sensor. The sensor driving circuit controls the sensor layer. The main driving circuit controls the display driving circuit and the sensor driving circuit and to operate in a first mode. In the first mode, the display driving circuit emits a first light through the light emitting element disposed in a first region of the active region. The display driving circuit receives a second light reflected based on the first light, through the sensing element disposed in the first region and a second region surrounding the first region. The main driving circuit determines whether the display layer and the sensor layer are placed in a pocket of a user, based on an amount of the second light.

In the first mode, the sensor driving circuit may operate the sensor layer in one of a touch sensing mode and a proximity sensing mode. In the touch sensing mode, the sensor driving circuit may operate for a plurality of first frame durations having a first operating frequency. Each of the plurality of first frame durations may include a first touch duration for sensing the touch of the user in a mutual touch manner, and a second touch duration for sensing the touch in a self-touch manner.

In the proximity sensing mode, the sensor driving circuit may operate the sensor layer for a plurality of second frame durations having a second operating frequency different from the first operating frequency, and each of the plurality of second frame durations may include a proximity sensing duration for sensing a proximity state of a conductor.

The width of the proximity sensing duration may be greater than the width of the first touch duration and the width of the second touch duration.

The voltage of the sensing signal provided to the plurality of first electrodes for the proximity sensing duration may be higher than a voltage of the sensing signal provided to the plurality of first electrodes for the first touch duration.

The voltage of the sensing signal provided to the plurality of first electrodes for the proximity sensing duration may be higher than the voltage of the sensing signal provided to the plurality of first electrodes for the second touch duration.

The main driving circuit may determine whether the display layer and the sensor layer are placed in the pocket of the user, based on the sensing value sensed for the proximity sensing duration.

The electronic device may further include a memory including a first characteristic of a capacitance measured in the sensor layer at a first temperature and a second characteristic of a capacitance measured in the sensor layer at a second temperature higher than the first temperature. The main driving circuit may determine that the display layer and the sensor layer are not placed in the pocket of the user, when the capacitance measured in the sensor layer corresponds to the first characteristic.

A first slope of a graph illustrating sensitivity of the capacitance to each of the plurality of second electrodes in the first characteristic may be greater than a second slope of the graph illustrating the sensitivity of the capacitance to the each of the plurality of second electrodes in a second characteristic.

The main driving circuit may determine that the display layer and the sensor layer are not placed in the pocket of the user, when a slope of the graph illustrating the sensitivity of the capacitance to each of the plurality of second electrodes in the sensor layer is greater than the first slope.

The pixel driving circuit may include a light emitting control line, the display driving circuit may output a light emitting control signal to the light emitting control line, and a waveform of the light emitting control signal provided to a pixel disposed in the first region is different from the waveform of the light emitting control signal provided to the pixel disposed in the second region.

The sensor may include a plurality of sensors disposed in the active region.

Brightness of the display layer in the first region may be higher than brightness when the display layer displays the image.

According to an embodiment, a method for driving an electronic device may include driving, by a main driving circuit, a display layer including a pixel within an active region to display an image in a first mode and a sensor, the pixel including a pixel driving circuit and a light emitting element, and the sensor including a sensor driving circuit and a sensing element; emitting a first light through the light emitting element disposed in a first of the active region, in the first mode; receiving a second light reflected based on the first light, through the sensing element disposed in the first region and a second region surrounding the first region, in the first mode; generating, by the main driving circuit, first sensing information when an object close to the display layer is sensed based on the second light; and determining whether the display layer and the sensor layer disposed on the display layer are placed in a pocket of a user based on the first sensing information.

The sensor layer may include a plurality of first electrodes and a plurality of second electrodes, a first slope of a graph illustrating sensitivity of a capacitance for each of the plurality of second electrodes at a first temperature may be greater than a second slope of a graph illustrating the sensitivity of the capacitance for each of the plurality of second electrodes at a second temperature higher than the first temperature. The method may further include determining that the display layer and the sensor layer are not placed in the pocket of the user, when a slope of the graph illustrating the sensitivity of the capacitance for each of the plurality of second electrodes in the sensor layer is greater than the second slope, and operating the sensor layer in a touch sensing mode, when the slope of the graph illustrating the sensitivity of the capacitance for each of the plurality of second electrodes in the sensor layer is less than the second slope.

The operating of the sensor layer in the touch sensing mode may include determining that the display layer and the sensor layer are not placed in the pocket of the user, when a touch of the user is sensed, and operating the sensor layer in a proximity sensing mode different from the touch sensing mode, when the touch is not sensed.

In the touch sensing mode, the sensor layer may be operated for a plurality of first frame durations having a first operating frequency, and each of the plurality of first frame durations may include a first touch duration for sensing a user touch in a mutual touch manner, and a second touch duration for sensing the touch in a self-touch manner.

The operating of the sensor layer in the proximity sensing mode may include determining that the display layer and the sensor layer are not placed in the pocket of the user, when a conductor is not sensed, and generating second sensing information indicate why the display layer and the sensor layer are placed in the pocket of the user, when the conductor is sensed.

In the proximity sensing mode, the sensor layer may be operated for a plurality of second frame durations having a second operating frequency different from the first operating frequency, and each of the plurality of second frame durations may include a proximity sensing duration for sensing a proximity state of the conductor.

The determining of whether the display layer and the sensor layer are placed in the pocket of the user may further include determining that the display layer and the sensor layer are disposed in the pocket of the user, by using the first sensing information and the second sensing information.

BRIEF DESCRIPTION OF THE FIGURES

The above and other objects and features of the present disclosure will become apparent by describing in detail embodiments thereof with reference to the accompanying drawings.

FIG. 2 is a block diagram schematically illustrating an electronic device according to an embodiment of the present disclosure.

DETAILED DESCRIPTION

Figure 1:
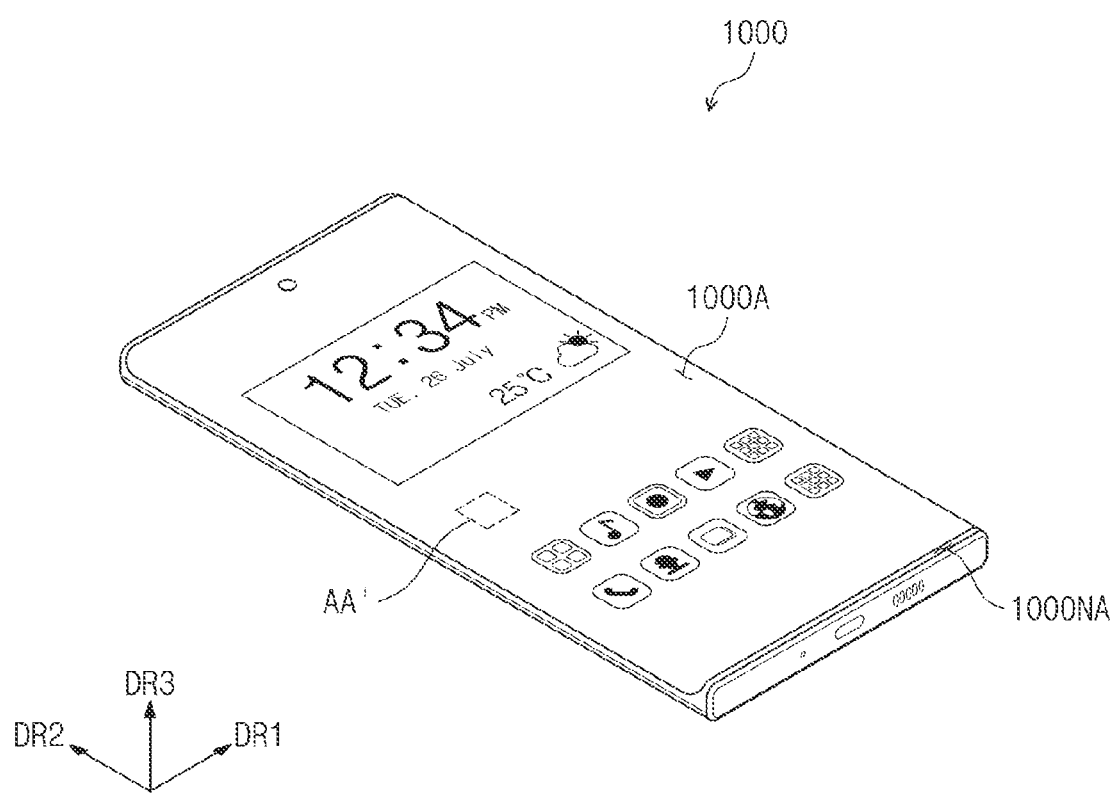
FIG. 1 is a perspective view of an electronic device according to an embodiment of the present disclosure.

In the specification, the expression that a first component (or region, layer, part, portion, etc.) is "on", "connected with", or "coupled to" a second component means that the first component is directly on, connected with, or coupled to the second component or means that a third component is disposed therebetween.

The same reference numeral refers to the same component. The expression "and/or" includes one or more combinations which associated components are capable of defining.

Although the terms "first", "second", etc. may be used to describe various components, the components should not be construed as being limited by the terms. The terms are only used to distinguish one component from another component. For example, without departing from the scope and spirit of the present disclosure, a first component may be referred to as a second component, and similarly, the second component may be referred to as the first component. The singular forms are intended to include the plural forms unless the context clearly indicates otherwise.

In addition, the terms "under", "below", "on", "above", etc. are used to describe the correlation of components illustrated in drawings. The terms that are relative in concept are described based on a direction shown in the drawings.

Hereinafter, embodiments of the present disclosure will be described.

FIG. 1 is a perspective view of an electronic device according to an embodiment of the present disclosure.

Referring to FIG. 1, an electronic device 1000 may be activated, in response to an electrical signal. For example, the electronic device 1000 may be a cellular phone, a foldable phone, a laptop computer, a television, a tablet, a vehicle navigation system, a game console, or a wearable device, but the present disclosure is not limited thereto. FIG. 1 illustrates that the electronic device 1000 is a cellular phone by way of example.

The electronic device 1000 may include an active region 1000A and a peripheral region 1000NA defined in the electronic device 1000. The electronic device 1000 may display an image through the active region 1000A. The active region 1000A may include a surface defined by a first direction DR1 and a second direction DR2. The peripheral region 1000NA may surround the active region 1000A.

The thickness direction of the electronic device 1000 may be parallel to a third direction DR3 crossing a first direction DR1 and a second direction DR2. Accordingly, front surfaces (or top surfaces) and rear surfaces (or bottom surfaces) of members constituting the electronic device 1000 may be defined based on the third direction DR3.

FIG. 2 is a block diagram schematically illustrating an electronic device according to an embodiment of the present disclosure.

Referring to FIG. 2, the electronic device 1000 may include a display layer 100, a sensor layer 200, a display driving unit 100C (e.g., a first circuit), a sensor driving unit 200C (e.g., a second circuit), and a main driving unit 1000C (e.g., a third circuit).

The display layer 100 may be a component to generate an image. The display layer 100 may display the image for a plurality of frame durations. The display layer 100 may be an emissive-type display layer. For example, the display layer 100 may be an organic light emitting display layer, a quantum dot display layer, a micro-light-emitting-diode (micro-LED) display layer, or a nano-LED display layer.

The sensor layer 200 may be disposed on the display layer 100. The sensor layer 200 may sense an external input 2000 or 3000 applied thereto from an outside. The external input 2000 or 3000 may include all inputs that provide a change in capacitance. For example, the sensor layer 200 may sense an input made by an active-type input unit to provide a transmission signal, as well as a passive-type input unit, such as a human body, of a user. The external input 2000 or 3000 may include an input made by the touch 2000 of the user and a proximity input by a large-area conductor 3000. The large-area conductor 3000 may be conductor with an area exceeding a certain area.

The main driving unit 1000C may control an overall operation of the electronic device 1000. For example, the main driving unit 1000C may control the operations of the display driving unit 100C and the sensor driving unit 200C. The main driving unit 1000C may include at least one microprocessor, and may be referred to as a "host". The main driving unit 1000C may further include a graphics controller.

The main driving unit 1000C may be connected to an external memory MM. The memory MM may store a characteristic (e.g., information) for determining the temperature of the sensor layer 200. The main driving unit 1000C may receive a characteristic for determining the temperature of the electronic device 1000 (see FIG. 1) from the memory MM. The details thereof will be described later.

The display driving unit 100C may drive the display layer 100 in unit of a plurality of frame durations or periods. The display driving unit 100C may receive image data RGB and a control signal D-CS from the main driving unit 1000C. The control signal D-CS may include various signals. For example, the control signal D-CS may include a mode determining signal for determining a driving mode, an input vertical synchronization signal, an input horizontal synchronization signal, a main clock signal, and a data enable signal. The display driving unit 100C may generate a scan control signal and a data control signal for controlling the driving of the display layer 100, in response to the control signal D-CS.

The display driving unit 100C may transmit a scan signal SC to the main driving unit 100C. The scan signal SC may include information sensed by a sensor FX (see FIG. 4).

The sensor driving unit 200C may drive the sensor layer 200. The sensor driving unit 200C may receive the control signal I-CS from the main driving unit 1000C. The control signal I-CS may include the mode determining signal for determining a driving mode of the sensor layer 200, and a clock signal.

The sensor driving unit 200C may calculate information on coordinates of a input, based on a signal received from the sensor layer 200, and may provide a coordinate signal I-SS including the coordinate information to the main driving unit 1000C. For example, the coordinate signal I-SS may indicate a position of the source of the input relative to the electronic device 1000. The main driving unit 1000C executes an operation corresponding to the user input, in response to the coordinate signal I-SS. For example, the main driving unit 1000C may operate the display driving unit 100C such that a new application image is displayed on the display layer 100.

The sensor driving unit 200C may sense the proximity of the large-area conductor 3000 spaced apart from the surface 1000SF of the electronic device 1000, in response to the signal received from the sensor layer 200. The large-area conductor 3000 may be referred to as a hovering object. The ear of a user in the proximity to the electronic device 1000 is illustrated as an example of the large-area conductor 3000. However, this is merely provided for illustrative purpose. For example, the large-area conductor 3000 may be a part of a physical body, such as the chest or the thigh of the user. The sensor driving unit 200C may provide a proximity sensing signal I-NS having sensing information of a near object, to the main driving unit 1000C. For example, the sensing information may indicate whether an external object such as the large-area conductor 3000 is within a certain distance from the surface 1000SF of the electronic device 1000.

The main driving unit 1000C may receive the proximity sensing signal I-NS, and process the proximity sensing signal I-NS through the combination of the proximity sensing signal I-NS and sensing values received from other sensors sensing the large-area conductor 3000. For example, the main driving unit 1000C may receive sensing values from the sensor layer 200, an infrared sensor, and a gesture sensor, and may determine a proximity state through the combination of the sensing values. In this case, the sensing values received from the sensor layer 200 may be the proximity sensing signal I-NS. For example, the proximity state may indicate whether the large-area conductor 300 is within a certain distance from the surface 1000SF of the electronic device 1000.

Figure 3A:
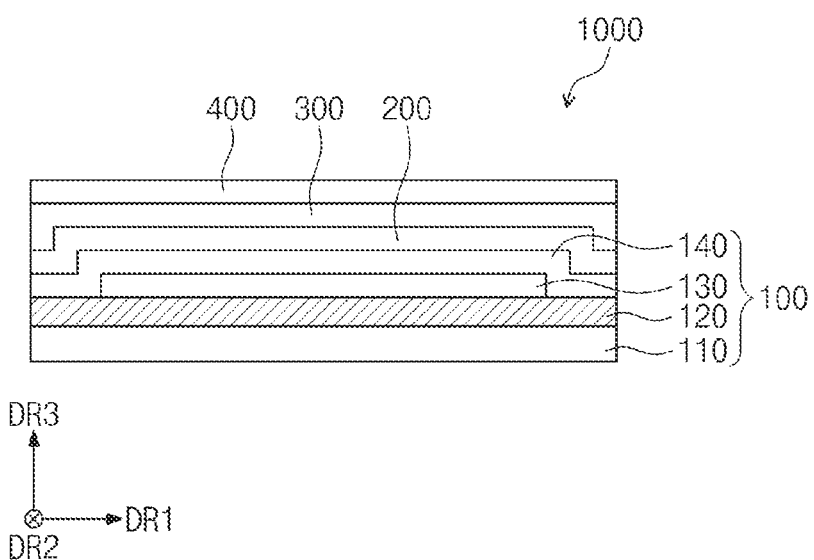
FIG. 3A is a cross-sectional view of an electronic device according to an embodiment of the present disclosure.

FIG. 3A is a cross-sectional view of an electronic device according to an embodiment of the present disclosure.

Referring to FIG. 3A, the electronic device 1000 may include a display layer 100, a sensor layer 200, an anti-reflection layer 300, and a window 400.

The display layer 100 may include a base layer 110, a circuit layer 120, a light emitting element layer 130, and an encapsulation layer 140.

The base layer 110 may be a member that provides a base surface for disposing the circuit layer 120. The base layer 110 may be a glass substrate, a metal substrate, a polymer substrate, or the like. However, embodiments of the disclosure are not limited thereto, and the base layer 110 may be an inorganic layer, an organic layer, or a composite material layer.

The circuit layer 120 may be disposed on the base layer 110. The circuit layer 120 may include an insulating layer, a semiconductor pattern, a conductive pattern, and a signal line. An insulating layer, a semiconductor layer, and a conductive layer may be formed on the base layer 110 through a coating or deposition process, and the insulating layer, the semiconductor layer, and the conductive layer may be selectively patterned through a plurality of photolithography processes. Thereafter, the semiconductor pattern, the conductive pattern, and the signal line included in the circuit layer 120 may be formed.

The light emitting element layer 130 may be disposed on the circuit layer 120. The light emitting element layer 130 may include a light emitting element. For example, the light emitting element layer 130 may include an organic light emitting material, an inorganic light emitting material, an organic-inorganic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from foreign substances such as moisture, oxygen, and dust particles.

The sensor layer 200 may be disposed on the display layer 100. The sensor layer 200 may be formed on the display layer 100 through a successive process. In this case, the sensor layer 200 may be expressed as being directly disposed on the display layer 100. The wording "~being directly disposed~" may indicate that a third component is not intervened between the sensor layer 200 and the display layer 100. In other words, an additionally adhesive member is not interposed between the sensor layer 200 and the display layer 100. Alternatively, the sensor layer 200 may be bonded to the display layer 100 through an adhesive member. The adhesive member may include an adhesive or a sticking agent.

The anti-reflection layer 300 may be disposed on the sensor layer 200. The anti-reflection layer 300 may reduce the reflectance of external light which is incident on the electronic device 1000 from the outside. The anti-reflection layer 300 may be directly disposed on the sensor layer 200. However, the present disclosure is not limited thereto, and an adhesive member may be further interposed between the anti-reflection layer 300 and the sensor layer 200.

The window 400 may be disposed on the anti-reflection layer 300. The window 400 may include an optically transparent material. For example, the window 400 may include glass or plastic. The window 400 may have a multi-layer structure or a single-layer structure. For example, the window 400 may include a plurality of plastic films coupled by an adhesive or may have a glass substrate and a plastic film coupled by an adhesive.

Figure 3B:
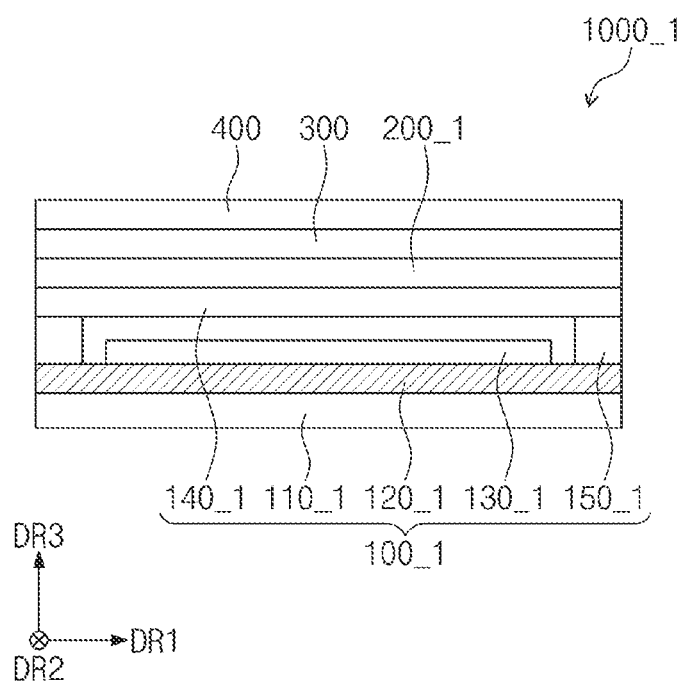
FIG. 3B is a cross-sectional view of an electronic device according to an embodiment of the present disclosure.

FIG. 3B is a cross-sectional view of an electronic device according to an embodiment of the present disclosure.

Referring to FIG. 3B, the electronic device 1000_1 may include a display layer 100_1, a sensor layer 200_1, an anti-reflection layer 300, and a window 400. The electronic device 1000_1 may be used to implement the electronic device 1000 of FIG. 2.

The display layer 100_1 may include a base substrate 110_1, a circuit layer 120_1, a light emitting element layer 130_1, an encapsulation substrate 140_1, and a coupling member 150_1.

Each of the base substrate 110_1 and the encapsulation substrate 140_1 may include a glass substrate, a metal substrate, or a polymer substrate, but is not specifically limited thereto.

The coupling member 150_1 may be interposed between the base substrate 110_1 and the encapsulation substrate 140_1. The coupling member 150_1 may couple the encapsulation substrate 140_1 to the base substrate 140_1 or the circuit layer 120_1. The coupling member 150_1 may include an inorganic material or an organic material. For example, the inorganic material may include a frit seal, and the organic material may include a photo-curable resin or a photo-plastic resin. However, a material constituting the coupling member 150_1 is not limited to the above example.

The sensor layer 200_1 may be directly disposed on the encapsulation substrate 140_1. In this case, "directly disposed" may mean that a third component is not interposed between the sensor layer 200_1 and the encapsulation substrate 140_1. In other words, a separate adhesive member is not interposed between the sensor layer 200_1 and the display layer 100_1. However, the present disclosure is not limited thereto. For example, an adhesive layer may be further interposed between the sensor layer 200_1 and the encapsulation substrate 140_1.

Figure 4:
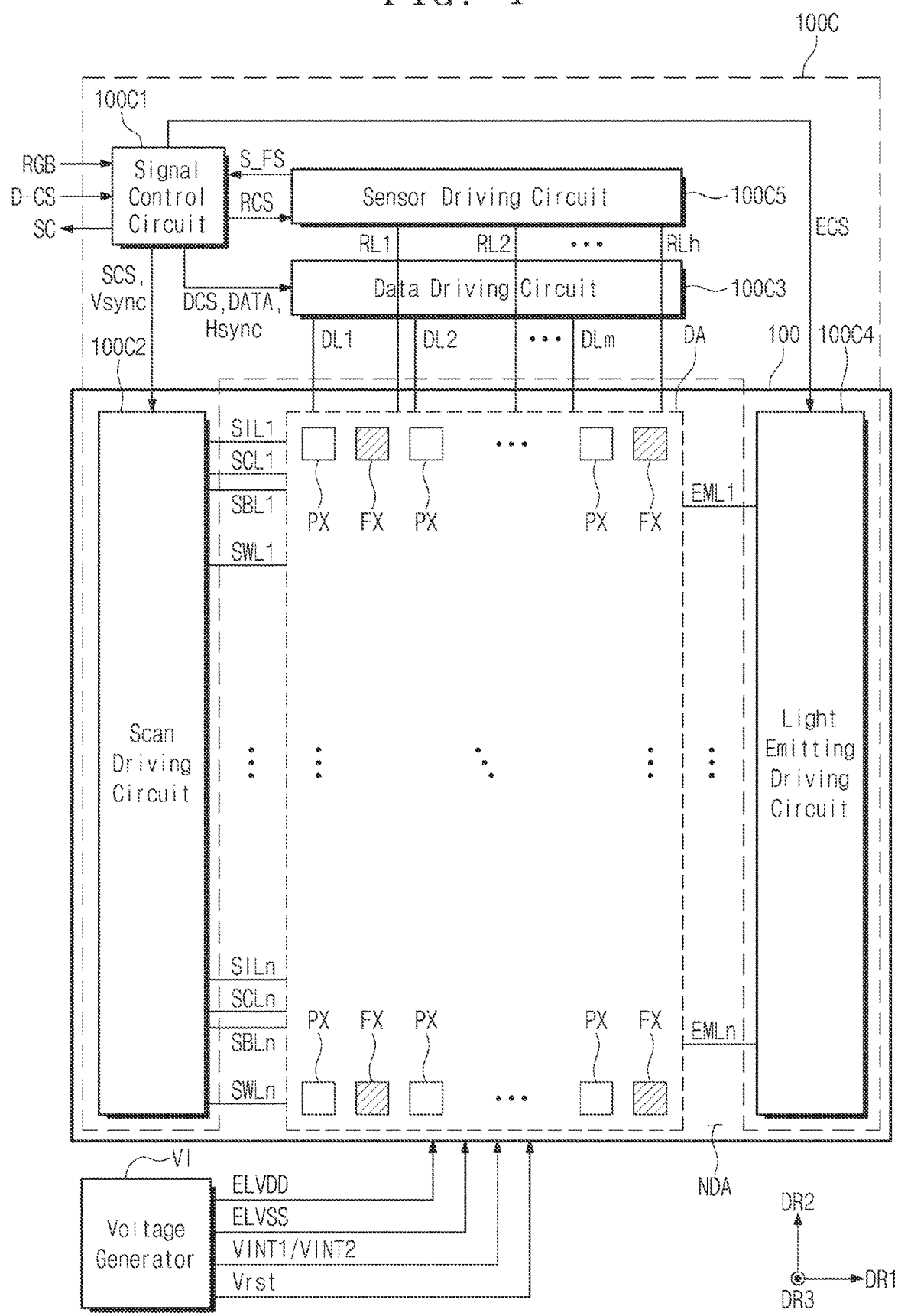
FIG. 4 is a block diagram illustrating an electronic device according to an embodiment of the present disclosure.

FIG. 4 is a block diagram illustrating an electronic device according to an embodiment of the present disclosure.

Referring to FIG. 4, the electronic device 1000 (see FIG. 1) may include a display layer 100, a display driving unit 100C, and a voltage generator VI.

The display driving unit 100C may include a signal control circuit 100C1, a scan driving circuit 100C2, a data driving circuit 100C3, a light emitting driving circuit 100C4, and a sensor driving circuit 100C5.

The signal control circuit 100C1 may receive image data RGB and a control signal D-CS from the main driving unit 1000C (see FIG. 2). The control signal D-CS may include various signals. For example, the control signal D-CS may include an input vertical synchronization signal, an input horizontal synchronization signal, a main clock, and a data enable signal.

The signal control circuit 100C1 may generate an output data signal DATA by converting a data format of the input image signal RGB to a format appropriate to the interface specification of the data driving circuit 100C3.

The signal control circuit 100C1 may generate a first control signal SCS and a vertical synchronization signal Vsync based on the control signal D-CS, and may output the first control signal SCS and the vertical synchronization signal Vsync to the scan driving circuit 100C2. The vertical synchronization signal Vsync may be included in the first control signal SCS.

The scan driving circuit 100C2 may output scan signals through scan lines SILn, SCLn, SBLn, and SWLn, in the response to the first control signal SCS. The scan lines SILn, SCLn, SBLn, and SWLn may include initialization scan lines SIL1 to SILn, compensation scan lines SCL1 to SCLn, write scan lines SWL1 to SWLn, and black scan lines SBL1 to SBLn The signal control circuit 100C1 may generate a second control signal DCS and a horizontal synchronization signal Hsync based on the control signal D-CS, and may output the second control signal DCS and the horizontal synchronization signal Hsync to the data driving circuit 100C3. The horizontal synchronization signal Hsync may be included in the second control signal DCS.

The data driving circuit 100C3 receives the second control signal DCS and the data signal DATA from the signal control circuit 100C1. The data driving circuit 100C3 transforms the data signal DATA into data signals and outputs the data signals to the data lines DL1 to DLm. The data signals are analog voltages corresponding to a grayscale value of the data signal DATA.

The data driving circuit 100C3 may be implemented in the form of an integrated circuit to be directly mounted in a specific region of the display layer 100 or be mounted on a separate printed circuit board in a chip on film manner, such that the data driving circuit 100C3 is electrically connected to the display layer 100. For example, the data driving circuit 100C3 may be formed in the same process as the circuit layer 120 (refer to FIG. 3A) in the display layer 100.

The signal control circuit 100C1 may generate a third control signal ECS, based on the control signal D-CS, and may output the third control signal ECS to the light emitting driving circuit 100C4.

The light emitting driving circuit 100C4 may output light emitting control signals to light emitting control lines EML1 to EMLn, in response to the second control signal ECS.

A voltage generator VI generates voltages used for an operation of the display panel 100. According to an embodiment, the voltage generator VI may generate a first driving voltage ELVDD, a second driving voltage ELVSS, a first initialization voltage VINT1, a second initialization voltage VINT2, and a reset voltage Vrst. The voltages generated by the voltage generator VI is not limited thereto.

The display layer 100 may include an active region DA and a peripheral region NDA defined in the electronic device 1000. The peripheral region NDA may be disposed to be adjacent to the active region DA. When viewed in a plan view, the active region DA of the display layer 100 may overlap with the active region 1000A (see FIG. 1) of the electronic device 1000 (see FIG. 1). The display layer 100 may include a plurality of pixels PX disposed in the active region DA and a plurality of sensors FX disposed in the active region DA.

According to an embodiment of the present disclosure, each of the plurality of sensors FX may be disposed between two adjacent pixels PX. The pixels PX and the sensors FX may be alternately disposed in the first and second directions DR1 and DR2. However, embodiments of the disclosure are not limited thereto. At least two pixels PX may be disposed between two sensors FX, which are adjacent to each other in the first direction DR1, of the plurality of sensors FX, or at least two pixels may be interposed between two sensors FX, which are adjacent to each other in the second direction DR2, of the plurality of sensors FX. The plurality of sensors FX may be disposed on the whole surface of the active region DA. For example, the sensors FX may be disposed through the active area region DA.

The initialization scan lines SIL1 to SILn, the compensating scan lines SCL1 to SCLn, the write scan lines SWL1 to SWLn+1, the black scan lines SBL1 to SBLn, and the light emitting control lines EML1 to EMLn may extend in the second direction DR2, and may be spaced apart from each other in the first direction DR1. The data lines DL1 to DLm and the readout lines RL1 to RLm extend in the first direction DR1 and are arranged to be spaced apart from each other in the second direction DR2.

The plurality of pixels PX are electrically connected with the initialization scan lines SIL1 to SILn, the compensation scan lines SCL1 to SCLn, the write scan lines SWL1 to SWLn+1, the black scan lines SBL1 to SBLn, the light emitting control lines EML1 to EMLn, and the data lines DL1 to DLm. Although it is illustrated that the plurality of pixels PX are electrically connected to four scan lines, respectively, the number of scan lines connected to each pixel PX is not limited thereto and may be varied.

The plurality of sensors FX may be electrically connected to write scan lines SWL1 to SWLn and readout lines RL1 to RLh, respectively. Although it illustrated that each of the plurality of sensors FX is electrically connected to one scan line, the present disclosure is not limited thereto. For example, the number of scan lines connected to each sensor FX may be varied. The number of the readout lines RL1 to RLh may be equal to or less than the number of data lines DL1 to DLm. For example, the number of readout lines RL1 to RLh may correspond to ½, ¼, or ⅛ of the number of data lines DL1 to DLm.

The scan driving circuit 100C2 may be disposed in the peripheral region NDA of the display layer 100. According to an embodiment of the present disclosure, the scan driving circuit 100C2 may be formed in the same process as that of the circuit layer 120 (see FIG. 3A), but the present disclosure is not limited thereto. For example, the scan driving circuit 100C2 may be implemented in the form of an integrated circuit (IC) and mounted directly in a specific region of the display layer 100, or mounted in the form of a chip on film (COF) manner on a separate printed circuit board, such that the scan driving circuit 100C2 is electrically connected to the display layer 100.

The scan driving circuit 100C2 may output initialization scan signals to the initialization scan lines SIL1 to SILn and compensation scan signals to the compensation scan lines SCL1 to SCLn in response to the first control signal SCS received from the signal control circuit 100C1. In addition, the scan driving circuit 100C2 may output write scan signals to the write scan lines SWL1 to SWLn and black scan signals to the black scan lines SBL1 to SBLn, in response to the first control signal SCS. According to an embodiment, the scan driving circuit 100C2 may include a first scan driver to output the initialization scan signals and the compensation scan signals, and a second scan driver to output the write scan signals and the black scan signals. However, embodiments of the disclosure are limited thereto.

The light emitting driving circuit 100C4 may be disposed in the peripheral region NDA of the display layer 100. The light emitting driving circuit 100C4 may output light emitting control signals to the light emitting control lines EML1 to EMLn, in response to the second control signal ECS received from the signal control circuit 100C1. According to an embodiment, although it is illustrated that the scan driving circuit 100C2 is distinguished from the light emitting driving circuit 100C4, the present disclosure is not limited thereto. For example, the scan driving circuit 100C2 may be connected to the light emitting control lines EML1 to EMLn to output the light emitting control signals so that the light emitting driving circuit 100C4 may be omitted.

The sensor driving circuit 100C5 may receive first sensing signals from the readout lines RL1 to RLh, in response to the fourth control signal RCS received from the signal control circuit 100C1. The sensor driving circuit 100C5 may process the first sensing signals S_FS received from the readout lines RL1 to RLh, and provide the processed first sensing signals S_FS to the signal control circuit 100C1. The signal control circuit 100C1 may acquire an external image based on the first sensing signals S_FS. For example, the image may include biometric information. The signal control circuit 100C1 may provide the sensing signals SC generated based on the first sensing signals S_FS to the main driving unit 1000C (see FIG. 2).

According to the present disclosure, the biometric information may be recognized in the entire portion of the active region DA through a plurality of sensors FX disposed on the whole surface of the active region DA. Accordingly, the electronic device 1000 (refer to FIG. 1) having increased reliability may be provided.

Figure 5:
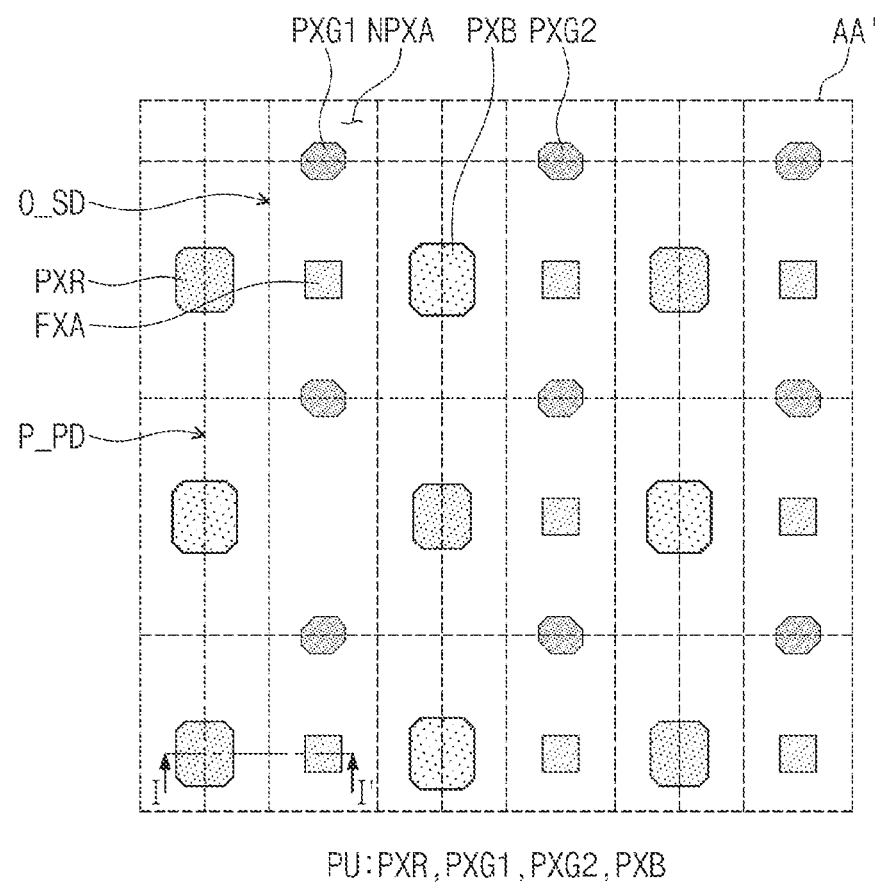
FIG. 5 is an enlarged plan view of region AA' of FIG. 1, according to an embodiment of the present disclosure.

FIG. 5 is an enlarged plan view of region AA' of FIG. 1, according to an embodiment of the present disclosure.

Referring to FIG. 5, the active region DA may include a plurality of pixel regions PXR, PXG1, PXG2, and PXB, a plurality of light receiving regions FXA, and a peripheral region NPXA. The peripheral region NPXA surrounds the pixel regions PXR, PXG1, PXG2, and PXB and the light receiving regions FXA, and may set boundaries of the pixel regions PXR, PXG1, PXG2, and PXB and the light receiving regions FXA.

Each of the pixel regions PXR, PXG1, PXG2, and PXB may correspond to a region in which a light emitting element OLED (see FIG. 6) is disposed. Each of the light receiving regions FXA may correspond to a region in which a sensing element OPD (see FIG. 6) is disposed. The pixel regions PXR, PXG1, PXG2, and PXB may include first pixel regions PXR, second pixel regions PXG1 and PXG2, and third pixel regions PXB. The first to third pixel regions PXR, PXG1, PXG2, and PXB may be classified depending on the color of emitted light. For example, each of the first pixel regions PXR may output a first color light, each of the second pixel regions PXG1 and PXG2 may output a second color light different from the first color light, and each of the third pixel regions PXB may output a third color light different from the first and second color light. For example, each of the first to third color lights may be a red light, a green light, or a blue light, respectively, but embodiments of the disclosure are not necessarily limited thereto.

The pixel regions PXR, PXG1, PXG2, and PXB may be grouped into a pixel unit PU. According to an embodiment, it is described that each pixel unit PU includes one first pixel region PXR, two second pixel regions PXG1 and PXG2, and one third pixel region PXB. However, the number of pixel regions constituting the pixel unit PUX is not limited thereto.

The first pixel region PXR and the third pixel region PXB may be alternately disposed in the first direction DR1 and the second direction DR2. The second pixel regions PXG1 and PXG2 may be disposed in the first direction DR1 and the second direction DR2. The second pixel regions PXG1 and PXG2 may be disposed in different rows and different columns from those of the first pixel region PXR and the third pixel region PXB, in the first direction DR1 and the second direction DR2.

In an embodiment, an area of each of the second pixel regions PXG1 and PXG2 is smaller than that of each of the first pixel region PXR and the third pixel region PXB. In an embodiment, the first pixel region PXR has an area smaller than that of the third pixel region PXB. However, the present disclosure is not limited thereto. For example, the first pixel region PXR and the third pixel region PXB may have an equal area, or all of the first to third pixel regions PXR, PXG1, PXG2, and PXB may have equal areas.

The first to third pixel regions PXR, PXG1, PXG2, and PXB may have mutually different shapes. For example, each of the first pixel region PXR and the third pixel region PXB may have the shape of an octagon extending in the second direction DR2, and the second pixel regions PXG1 and PXG2 may have the shape an octagon extending in the first direction DR1 different from the extending direction of the first pixel region PXR. Some of the second pixel regions PXG1 and PXG2 may have a shape symmetrical to each other. However, the shapes of the first to third pixel regions PXR, PXG1, PXG2, and PXB are not limited to those illustrated, but may have various shapes such as oval, circular, and rectangular shapes.

The light receiving regions FXA may be disposed in the first direction DR1 and the second direction DR2. The light receiving regions FXA may be interposed between the second pixel regions PXG1 and PXG2 in the first direction DR1, and may be interposed between the first pixel region PXR and the third pixel region PXB in the second direction DR2.

The light receiving regions FXA may have rectangular shape. In an embodiment, the light receiving regions have an area smaller than an area of each of the first to third pixel regions PXR, PXG1, PXG2, and PXB, when viewed in a plan view. However the embodiment is not limited thereto.

A pixel driving circuit P_PD connected to the light emitting element OLED (see FIG. 6) and a sensor driving circuit O_SD connected to a sensing element OPD (see FIG. 6) may be disposed in the active region DA. The pixel driving circuit P_PD may be disposed adjacent to the light emitting element OLED (see FIG. 6), and the sensor driving circuit O_SD may be disposed adjacent to the sensing element OPD (see FIG. 6).

Figure 6:
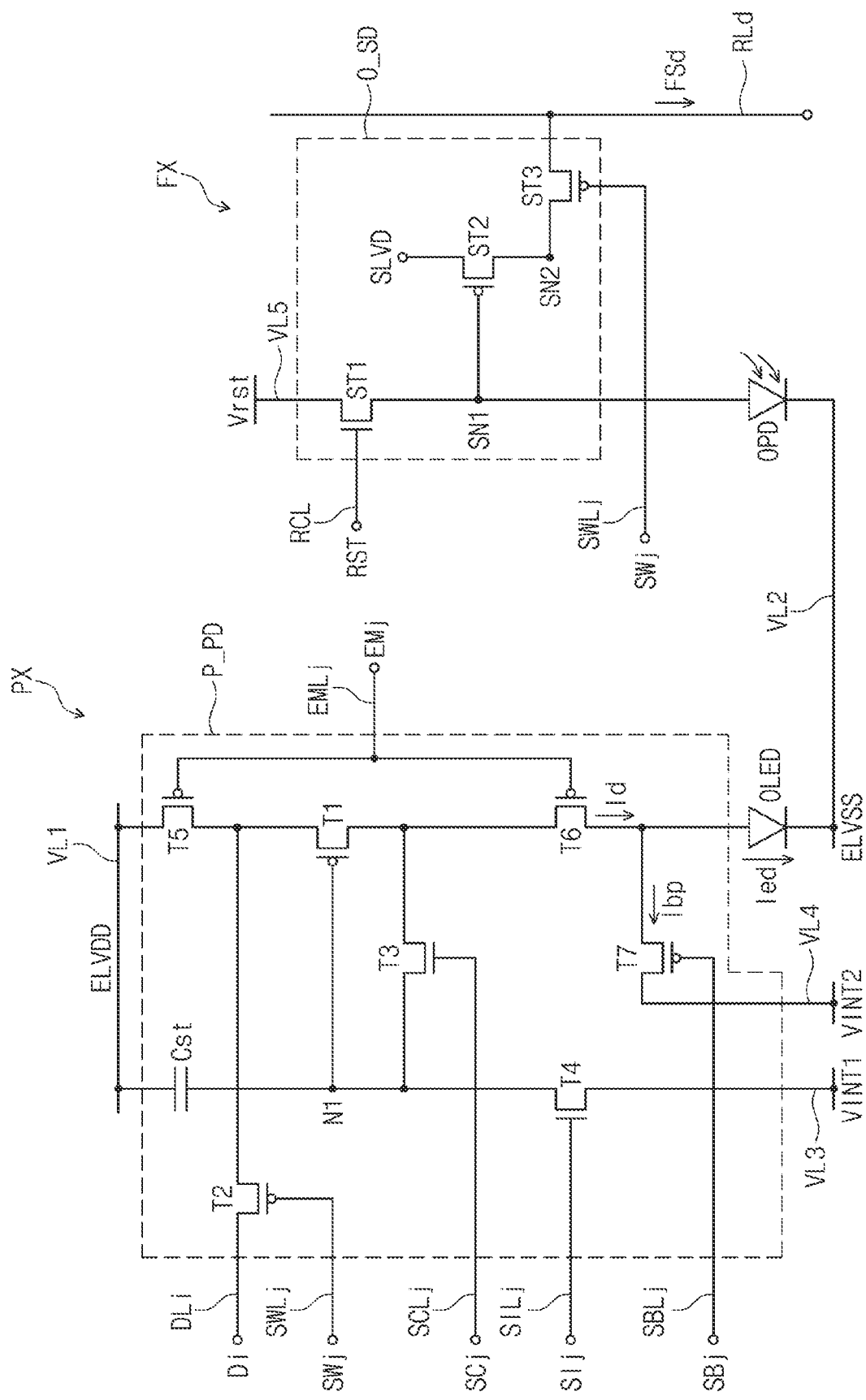
FIG. 6 is an equivalent circuit diagram of a pixel and a sensor according to an embodiment of the present disclosure.

FIG. 6 is an equivalent circuit diagram of a pixel and a sensor according to an embodiment of the present disclosure.

Referring to FIG. 6, the pixel PX may be connected to an i-th data line DLi of the data lines DL1 to DLm, a j-th initialization scan line SILj of the initialization scan lines SIL1 to SILn, a j-th compensation scan line SCLj of the compensation scan lines SCL1 to SCLn, a j-th write scan line SWLj of the write scan lines SWL1 to SWLnL, a j-th black scan line SBLj of the black scan lines SBL1 to SBLn, and a j-th light emitting control line EMLj of the light emitting control lines EML1 to EMLn. In this case, i and j are natural numbers.

The pixel PX may include the light emitting element OLED and the pixel driving circuit P_PD. The light emitting element OLED may be a light emitting diode, and for example, the light emitting element OLED may be an organic light emitting diode including an organic light emitting layer. The pixel driving circuit P_PD may be connected to the light emitting element OLED to control an amount of current flowing through the light emitting element OLED, and the light emitting element OLED may generate light having specific brightness depending on the amount of current provided.

The pixel driving circuit P_PD may include first to seventh transistors T1 to T7 and a capacitor Cst. Each of the first to seventh transistors T1 to T7 may be a transistor having a low-temperature polycrystalline silicon (LTPS) semiconductor layer or a transistor having an oxide semiconductor layer. In addition, each of the first to seventh transistors T1 to T7 may be a P-type transistor or an N-type transistor. For example, the first, second, fifth, sixth, and seventh transistors T1, T2, T5, T6, and T7 may be p-channel metal-oxide semiconductor (PMOS) transistors having the LTPS semiconductor layer, and the third and fourth transistors T3 and T4 may be n-channel metal-oxide semiconductor (NMOS) transistors having the oxide semiconductor layer. However, this is provided merely for illustrative purpose, and embodiments of the first to seventh transistors T1 to T7 are not limited thereto.

The j-th initialization scan line SILj, the j-th compensation scan line SCLj, the j-th write scan line SWLj, the j-th black scan line SBLj, and the j-th light emitting control line EMLj may transmit the j-th initialization scan signal SIj, the j-th compensation scan signal SCj, the j-th write scan signal SWj, the j-th black scan signal SBj, and the j-th light emission control signal EMj to the pixel PX, respectively. The i-th data line DLi may transmit the i-th data signal Di to the pixel PX. The i-th data signal Di may have a voltage level corresponding to image data RGB (see FIG. 3) input to the electronic device ED (see FIG. 3).

The first and second voltage lines VL1 and VL2 may transmit the first driving voltage ELVDD and the second driving voltage ELVSS to the pixel PX, respectively. In addition, the third and fourth voltage lines VL3 and VL4 may transmit the first initialization voltage VINT1 and the second initialization voltage VINT2 to the pixel PX, respectively.

The light emitting element OLED may include a first electrode and a second electrode. The first electrode of the light emitting element OLED may be electrically connected to the first voltage line VL1 receiving the first driving voltage ELVDD through at least one transistor. The second electrode of the light emitting element OLED may be electrically connected to the second voltage line VL2 receiving the second driving voltage ELVSS. The first electrode of the light emitting element OLED may be electrically connected to the first voltage line VL1 receiving the first driving voltage ELVDD via at least one transistor.

Each of the first to seventh transistors T1 to T7 may include a first electrode, a second electrode, and a gate electrode. According to an embodiment of the present disclosure, the first electrode and the second electrode may be defined as an input electrode or an output electrode (or a source electrode or a drain electrode). Meanwhile, in the present specification, the wording "electrical connection to a transistor and a signal line or a transistor and a transistor" refers to "an electrode of the transistor having an integral shape with the signal line or is connected to the signal line through the connection electrode."

The first transistor T1 may be electrically connected between the first voltage line VL1 for receiving the first driving voltage ELVDD and the light emitting element OLED. The first transistor T1 includes a first electrode connected to the first driving voltage line VL1 through the fifth transistor T5, a second electrode electrically connected to a first electrode of the light emitting element ED through the sixth transistor T6, and a gate electrode connected to one end of the capacitor Cst. The first transistor T1 may receive a data signal Di transmitted through the data line DLi in response to a switching operation of the second transistor T2 and may supply the driving current Id to the light emitting element OLED. The first transistor T1 may be referred to as a driving transistor.

The second transistor T2 may be electrically connected between the data line DLi and the first electrode of the first transistor T1. The second transistor T2 may include a first electrode connected to the data line DLi, a second electrode connected to the first electrode of the first transistor T1, and a gate electrode connected to the j-th write scan line SWLj. The second transistor T2 may be turned on in response to the write scan signal SWj transmitted through the j-th write scan line SWLj to transmit the data signal Di transmitted from the data line DLi to the first electrode of the first transistor T1. The second transistor T2 may be referred to as a switching transistor.

The third transistor T3 may be electrically connected between the second electrode of the first transistor T1 and the first node N1 connected to the gate electrode of the first transistor T1. The third transistor T3 may include a first electrode connected to the data line DLi, a second electrode connected to the first electrode of the first transistor T1, and a gate electrode connected to the j-th compensation scan line SCLj. The third transistor T3 may be turned on in response to the j-th compensation scan signal SCj transmitted through the j-th compensation scan line SCLj to connect the gate electrode of the first transistor T1 and the second electrode of the first transistor T1, such that the first transistor T1 is diode-connected. The third transistor T3 may be referred to as a compensation transistor.

The fourth transistor T4 may be electrically connected between the third voltage line VL3 for transmitting the first initialization voltage VINT1, and the first node N1. The fourth transistor T4 may include a first electrode connected to the third voltage line VL3, a second electrode connected to the first node N1, and a gate electrode connected to the j-th initialization scan line SILj. The fourth transistor T4 may be turned on in response to the j-th initialization scan signal SIj received through the j-th initialization scan line SILj to transmit the first initialization voltage VINT1 to the first node N1, and may initialize the potential of the gate electrode of the first transistor T1. The fourth transistor T4 may be referred to as an initialization transistor.

The fifth transistor T5 may be electrically connected between the first voltage line VL1 and the first transistor T1. The fifth transistor T5 may include a first electrode connected to the first voltage line VL1, a second electrode connected to the first electrode of the first transistor T1, and a gate electrode connected to the j-th light emitting control line EMLj.

The sixth transistor T6 may be electrically connected between the first transistor T1 and the light emitting element OLED. The sixth transistor T6 may include a first electrode connected to the second electrode of the first transistor T1, a second electrode connected to the first electrode of the light emitting element OLED, and a gate electrode connected to the j-th light emitting control line EMLj.

The fifth transistor T5 and the sixth transistor T6 may be turned on according to the light emitting control signal EMj received through the j-th light emitting control line EMLj. The light emitting time of the light emitting element OLED may be controlled by the light emitting control signal EMj. When the fifth transistor T5 and the sixth transistor T6 are turned on, a driving current Id is generated by a voltage difference between the gate voltage of the gate electrode of the first transistor T1 and the first driving voltage ELVDD, and the driving current Id is supplied to the light emitting diode OLED through the sixth transistor T6, such that the light emitting element OLED may emit light. The fifth transistor T5 and the sixth transistor T6 may be referred to as light emitting control transistors.

The seventh transistor T7 may be electrically connected between the fourth voltage line VL4 for transmitting the second initialization voltage VINT2, and the sixth transistor T6. The seventh transistor T7 may include a first electrode connected to the fourth voltage line VL4, a second electrode connected to the second electrode of the sixth transistor T6, and a gate electrode connected to the j-th black scan line SBLj. The seventh transistor T7 may be referred to as an initialization transistor.

The seventh transistor T7 may be turned on in response to the j-th black scan signal SBj received through the j-th black scan line SBLj. A portion of the driving current Id may be discharged through the seventh transistor T7 while functioning as the bypass current Ibp by the seventh transistor T7. When the black image is displayed, a current (in other words, the light emitting current Ied) obtained by reducing an amount of the bypass current Ibp, which is discharged through the seventh transistor T7, from the driving current Id is provided to the light emitting element OLED, such that the black image is clearly displayed. In other words, the contrast ratio of the electronic device ED (see FIG. 1) may be increased by implementing an accurate black brightness image through the seventh transistor T7. According to an embodiment, the low-level black scan signal SBj may turn on the seventh transistor T7 while functioning as a bypass signal, but the present disclosure is not limited thereto.

The one end of the capacitor Cst may be connected to the gate electrode of the first transistor T1, and the opposite end of the capacitor Cst may be connected to the first voltage line VL1. Charges corresponding to a voltage difference between the one end and the opposite end may be stored in the capacitor Cst. When the fifth transistor T5 and the sixth transistor T6 are turned on, an amount of current flowing through the first transistor T1 may be determined depending on the voltage stored in the capacitor Cst.

However, a configuration of the pixel driving circuit P_PD according to the present disclosure is not limited to the embodiment illustrated in FIG. 6. The pixel driving circuit P_PD illustrated in FIG. 6 is merely an example, and the configuration of the pixel driving circuit P_PD may be variously modified and implemented.

The sensor FX may be connected to a d-th readout line RLd, the j-th write scan line SWLj, and the reset control line RCL among the readout lines RL1 to RLh. In this case, 'd' may be a natural number.

The sensor FX may include the sensing element OPD and the sensor driving circuit O_SD connected to the sensing element OPD. The sensing element OPD may be a photodiode, and for example, may be an organic photodiode including an organic material in a photoelectric conversion layer. Although FIG. 6 illustrates one sensing element OPD connected to the sensor driving circuit O_SD by way of example, embodiments of the disclosure are not limited thereto. For example, the sensor FX may include a plurality of sensing elements connected in parallel to the sensor driving circuit O_SD.

The sensor driving circuit O_SD may include three transistors ST1 to ST3. The three transistors ST1 to ST3 may include a reset transistor ST1, an amplification transistor ST2, and an output transistor ST3. Each of the reset transistor ST1, the amplification transistor ST2, and the output transistor ST3 may be a transistor having a low-temperature polycrystalline silicon (LTPS) semiconductor layer or a transistor having an oxide semiconductor layer. In addition, each of the reset transistor ST1, the amplification transistor ST2, and the output transistor ST3 may be a P-type transistor, or an N-type transistor. For example, the reset transistor ST1 may be an NMOS transistor having an oxide semiconductor layer, and each of the amplification transistor ST2 and the output transistor ST3 may be a PMOS transistor having an LTPS semiconductor layer. However, this is merely provided for illustrative purpose, and embodiments of transistors ST1 to ST3 included in the sensor driving circuit O_SD are not limited thereto.

The reset control line RCL may receive a reset control signal RST and transmit the reset control signal RST to the sensor FX, and the fifth voltage line VL5 may receive a reset voltage Vrst and transmit the reset voltage Vrst to the sensor FX.

The sensing element OPD may include a first electrode and a second electrode. The first electrode of the sensing element OPD may be connected to the first sensing node SN1, and the second electrode of the sensing element OPD may be connected to the second voltage line VL2 receiving the second driving voltage ELVSS. The second electrode of the sensing element OPD may be electrically connected to the second electrode of the light emitting element OLED. For example, the second electrode of the sensing element OPD and the second electrode of the light emitting element OLED may be integrally formed to form a common cathode electrode C_CE (see FIG. 7). According to an embodiment, the first electrode of the sensing element OPD may correspond to a sensing anode electrode, and the second electrode of the sensing element OPD may correspond to a sensing cathode electrode.

Each of the first to seventh transistors ST1 to ST3 of the sensor driving circuit O_SD may include a first electrode, a second electrode, and a gate electrode. According to an embodiment of the present disclosure, the first electrode and the second electrode may be defined as an input electrode or an output electrode (or a source electrode or a drain electrode).

The reset transistor ST1 may include a first electrode connected to the fifth voltage line VL5 for receiving the reset voltage Vrst, a second electrode connected to the first sensing node SN1, and a gate electrode connected to the reset control line RCL for receiving the reset control signal RST. The reset transistor ST1 may reset the potential of the first sensing node SN1 to the reset control signal RST in response to the reset control signal RST. The reset control signal RST may be a signal provided through the reset control line RCL. However, the present disclosure is not limited thereto. For example, the reset control signal RST may be the j-th compensation scan signal SCj supplied through the j-th compensation scan line SCLj. In other words, according to an embodiment, the reset transistor ST1 may receive the j-th compensation scan signal SCj supplied from the j-th compensation scan line SCLj and functioning as the reset control signal RST.

According to an embodiment of the present disclosure, the reset voltage Vrst may have a voltage level lower than that of the second driving voltage ELVSS during at least an activation duration of the reset control signal RST. The reset voltage Vrst may be a direct current (DC) voltage maintained at a voltage level lower than the second driving voltage ELVSS.

The amplification transistor ST2 may include a first electrode configure to receive the sensing driving voltage SLVD, a second electrode connected to the second sensing node SN2, and a gate electrode connected to the first sensing node SN1. The amplification transistor ST2 may be turned on depending on the potential of the first sensing node SN1 to apply the sensing driving voltage SLVD to the second sensing node SN2.

The sensing driving voltage SLVD may be one of the first driving voltage ELVDD and the first and second initialization voltages VINT1 and VINT2. When the sensing driving voltage SLVD is the first driving voltage ELVDD, the first electrode of the amplification transistor ST2 may be electrically connected to the first voltage line VL1. When the sensing driving voltage SLVD is the first initialization voltage VINT1, the first electrode of the amplification transistor ST2 may be electrically connected to the third voltage line VL3. When the sensing driving voltage SLVD is the second initialization voltage VINT2, the first electrode of the amplification transistor ST2 may be electrically connected to the fourth voltage line VL4.

The output transistor ST3 may include a first electrode connected to the second sensing node SN2, a second electrode connected to the d-th readout line RLd, and a third electrode to receive an output control signal. The output transistor ST3 may transmit the sensing signal FSd to the readout line RLd in response to the output control signal. The output control signal may be a j-th write scan signal SWj supplied through the j-th write scan line SWLj. In other words, the output transistor ST3 may receive the write scan signal SWj supplied from the write scan line SWLj, as an output control signal The sensing element OPD of the sensor FX may be exposed to light output from the light emitting element OLED for a light emitting duration of the light emitting element OLED. When the physical body 3000 (see FIG. 2) touches the electronic device 1000 (see FIG. 2), the sensing element OPD may generate optical charges corresponding to light reflected from a ridge of a fingerprint of a finger of a user or a valley between ridges of the fingerprint. The amount of current flowing through the sensing element OPD may be varied through the generated optical charges.

The amplification transistor ST2 may be a source follower amplifier to generate a source-drain current, in proportion to a potential of the first sensing node SN1 input to the gate electrode. When the low-level j-th write scan signal SWj is supplied to the output transistor ST3, the output transistor ST3 may be turned on, such that the sensing signal FSd corresponding to the current flowing through the amplification transistor ST2 may be output to the readout line RLd.

When the high-level reset control signal RST is supplied through the reset control line RCL during a next reset duration, the reset transistor ST1 may be turned on. The reset duration may be defined as an activation duration (i.e., a high level duration) of the reset control line RCL. However, the present disclosure is not limited thereto. When the reset transistor ST1 is a PMOS transistor, a low-level reset control signal RST may be supplied to the reset control line RCL during a reset duration. During the reset duration, the first sensing node SN1 may be reset to have a potential corresponding to the reset voltage Vrst. When the next reset duration ends, the sensing element OPD may generate photocharges corresponding to the received light, and the generated photocharges may be accumulated in the first sensing node SN1.

However, a configuration of the sensor driving circuit O_SD according to the present disclosure is not limited to the embodiment illustrated in FIG. 6. The sensor driving circuit O_SD illustrated in FIG. 6 is merely for illustrative purpose, and the configuration of the sensor driving circuit O_SD may be variously modified and implemented.

Figure 7:
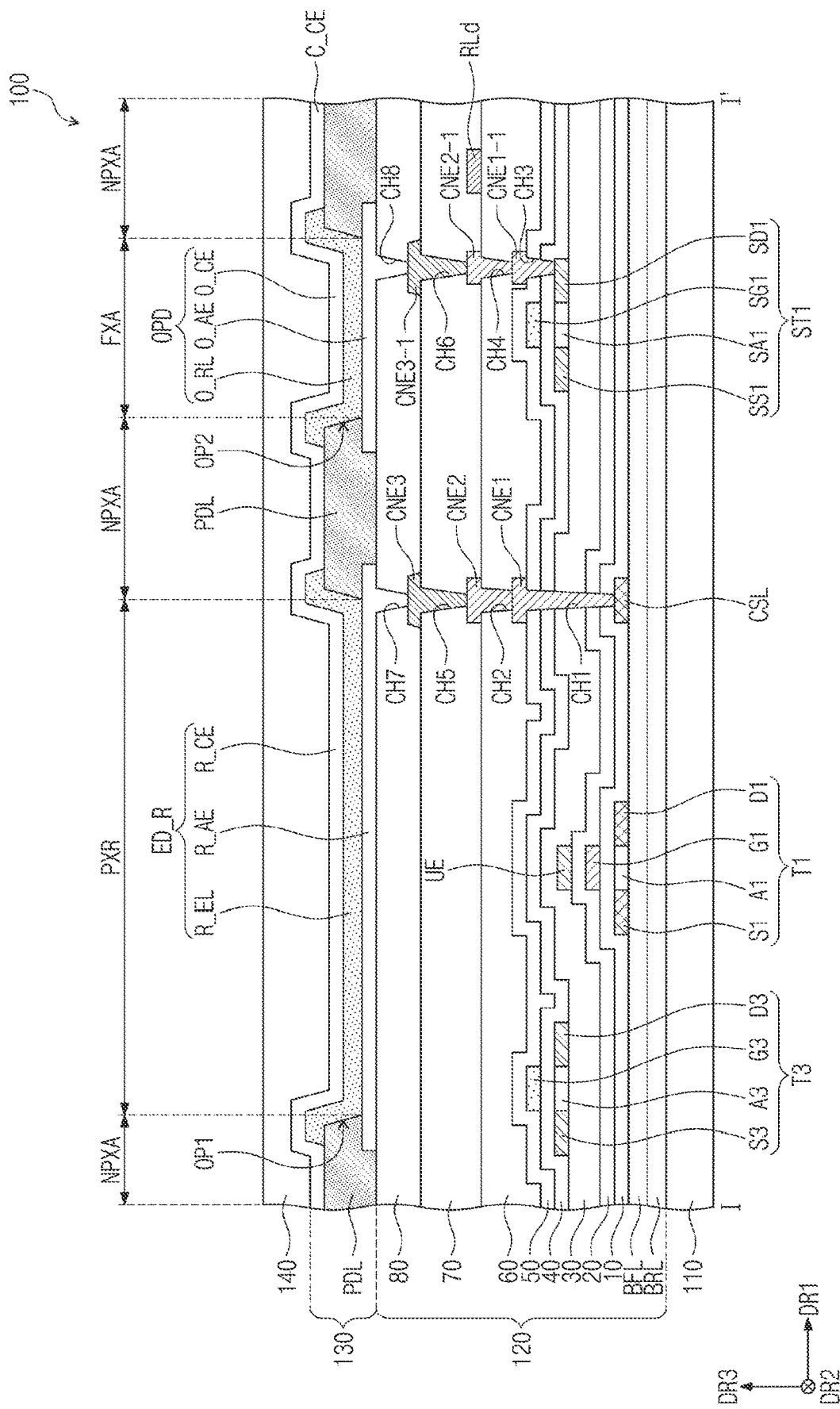
FIG. 7 is a cross-sectional view of a display layer taken along I-I' of FIG. 5 according to an embodiment of the present disclosure.

FIG. 7 is a cross-sectional view of a display layer taken along I-I' of FIG. 5 according to an embodiment of the present disclosure.

Referring to FIG. 7, the display layer 100 may include a base layer 110, a circuit layer 120, a light emitting element layer 130, and an encapsulation layer 140.

The base layer 110 may provide a base surface for disposing the circuit layer 120. The base layer 110 may include a synthetic resin layer. The synthetic resin layer may include a thermosetting resin. For example, the synthetic resin layer may include at least one of an acrylic resin, a methacrylic resin, a polyisoprene, a vinyl resin, an epoxy resin, a urethane resin, a cellulose resin, a siloxane resin, a polyamide resin, or a perylene resin. In addition, the base layer 110 may include a glass substrate, a metal substrate, or an organic/inorganic composite material substrate.

The circuit layer 120 may be disposed on the base layer 110. The circuit layer 120 may include the pixel driving circuit P_PD (see FIG. 6) included in the pixel PX (see FIG. 6) to display an image and the sensor driving circuit O_SD (see FIG. 6) included in the sensor FX (see FIG. 6) to recognize biometric information. The circuit layer 120 may further include signal lines connected to the pixel driving circuit P_PD (see FIG. 6) or the sensor driving circuit O_SD (see FIG. 6).

The circuit layer 120 may include at least one insulating layer constituting the driving circuits, a semiconductor pattern, or a conductive pattern. An insulating layer, a semiconductor layer, and a conductive layer may be formed on the base layer 110 through a coating or deposition process. Thereafter, the insulating layer, the semiconductor layer, and the conductive layer may be patterned through a photolithography process to form a semiconductor pattern and a conductive pattern The circuit layer 120 may include a barrier layer BRL and/or a buffer layer BFL. The barrier layer BRL may prevent foreign substances from being introduced from the outside. The barrier layer BRL may include a silicon oxide layer and a silicon nitride layer. According to an embodiment, a plurality of barrier layers BRL may be provided and may include silicon oxide layers and silicon nitride layers alternately stacked with each other.

A buffer layer BFL may be disposed on the barrier layer BRL. The buffer layer BFL may increase a coupling force between the base layer 110 and the semiconductor pattern and/or the conductive pattern. The buffer layer BFL may include a silicon oxide layer and a silicon nitride layer alternately stacked with each other.

The circuit layer 120 may include a first semiconductor pattern layer and a second semiconductor pattern layer disposed on mutually different layers. However, the cross-section of the circuit layer 120 of the present disclosure is not limited thereto and may be varied depending on the structure of the driving circuits.

The first semiconductor pattern layer of the circuit layer 120 may be disposed on the buffer layer BFL. For example, the first semiconductor pattern layer may be directly disposed on the buffer layer BFL. The first semiconductor pattern layer may include a silicon semiconductor. The first semiconductor pattern layer may include polysilicon, but the present disclosure is not limited thereto. For example, the first semiconductor pattern may include amorphous silicon.

The first semiconductor pattern layer may include a plurality of regions having mutually different electrical properties depending on whether doped. The first semiconductor pattern layer may include a first region having higher conductivity and a second region having lower conductivity. The first region may be doped with an N-type dopant or a P-type dopant. The P-type transistor may include a doping region doped with a P-type dopant, and the N-type transistor may include a doping region doped with an N-type dopant. The second region may be a non-doping region or a region doped at a lower concentration than the concentration of the first region.

The conductivity of the first region may be greater than the conductivity of the second region, the first region may function as a source electrode and a drain electrode of the transistor, and the second region may substantially correspond to an active (or channel) of the transistor. In other words, the first region, which has higher conductivity, of the first semiconductor pattern layer may be a source or drain of a transistor or a connection signal line, and the second region having low conductivity may be the active of the transistor.

A first source electrode S1, a first active A1, and a first drain electrode D1 of the first transistor T1 may be formed from the first semiconductor pattern layer. The first source electrode S1 and the first drain electrode D1 may extend in opposite directions from the first active A1. According to an embodiment, the first source electrode S1, the first active A1, and the first drain electrode D1 of the first transistor T1 may be defined as a first semiconductor pattern. In other words, the first semiconductor pattern layer may include a first semiconductor pattern.

The connection signal line CSL may be formed from the first semiconductor pattern layer and may be disposed on the buffer layer BFL. The connection signal line CSL may be electrically connected to the first semiconductor pattern of the first transistor T1, when viewed in a plan view The circuit layer 120 may include a plurality of insulating layers disposed on the base layer 110. FIG. 6 illustrates first to eighth insulating layers 10 to 80 as an example of the plurality of insulating layers. However, the number of insulating layers of the circuit layer 120 is not limited thereto. For example, the number of insulating layers may be varied depending on the components or the stacking process of forming the circuit layer DP-CL.

Each of the first to eighth insulating layers 10 to 80 may be an inorganic layer and/or an organic layer, and may have a single-layer or multi-layer structure. The inorganic layer may include at least one of aluminum oxide, titanium oxide, silicon oxide, silicon nitride, silicon oxynitride, zirconium oxide, or hafnium oxide. However, the material of the inorganic layer is not limited to the above example. For example, the organic layer may include at least one of acrylic resin, methacrylic resin, polyisoprene, vinyl resin, epoxy resin, urethane resin, cellulose resin, siloxane resin, polyamide resin, or a perylene resin. However, the material of the organic layer is not limited to the above example.

A first insulating layer 10 may be disposed on the buffer layer BFL. The first insulating layer 10 may be overlapped with the pixels PX (see FIG. 4) in common to cover the first semiconductor pattern layer. In other words, the first insulating layer 10 may cover the first semiconductor pattern of the first transistor T1 and the connection signal line CSL.

The first gate electrode G1 of the first transistor T1 may be disposed on the first insulating layer 10. The first gate electrode G1 may be overlapped with the first active A1 when viewed in a plan view. In the process of doping the first semiconductor pattern, the first gate electrode G1 may function as a mask.

A second insulating layer 20 may be disposed on the first insulating layer 10 to cover the first gate electrode G1. An upper electrode UE may be disposed on the second insulating layer 20. The upper electrode UE may be a portion of a metal pattern or a portion of a semiconductor pattern which is doped. A portion of the first gate electrode G1 and the upper electrode UE overlapping the portion of the first gate electrode G1 may define the capacitor Cst (see FIG. 6) of the pixel PX (see FIG. 6). However, according to an embodiment, the upper electrode UE may be omitted.

According to an embodiment of the present disclosure, the second insulating layer 20 may be substituted with an insulating pattern. The upper electrode UE and the first gate electrode G1 may be spaced apart from each other with an insulating pattern interposed therebetween. In this case, the upper electrode UE may function as a mask for forming an insulating pattern from the second insulating layer 20.

A third insulating layer 30 may be disposed on the second insulating layer 20 to cover the upper electrode UE. The second semiconductor pattern layer may be disposed on the third insulating layer 30. The second semiconductor pattern layer may be disposed on a layer different from the first semiconductor pattern layer described above.

The second semiconductor pattern layer may include an oxide semiconductor including a metal oxide. The oxide semiconductor may include a crystalline or amorphous oxide semiconductor. For example, the oxide semiconductor may include a metal oxide, such as zinc (Zn), indium (In), gallium (Ga), tin (Sn), titanium (Ti), or a mixture of metal, such as zinc (Zn), indium (In), gallium (Ga), tin (Sn), OR titanium (Ti), or the oxide thereof. The oxide semiconductor may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), or zinc-tin oxide (ZTO).

The second semiconductor pattern layer may include a plurality of regions having mutually different electrical properties depending on whether doped. A region (hereinafter referred to as a "reduction region"), in which the metal oxide is reduced, may have higher conductivity than a region (hereinafter referred to as a "non-reduction region") in which the metal oxide is not reduced. The reduction region may actually function as a source electrode or a drain electrode of the transistor. The non-reduction region may correspond to an active (or channel) of a transistor.

According to an embodiment, the third source electrode S3, a third active A3, and the third drain electrode D3 of the third transistor T3 may implement a second semiconductor pattern. The third source electrode S3 and the third drain electrode D3 may extend in opposite directions from the third active A3. According to an embodiment, the third source electrode S3, the third active A3, and the third drain electrode D3 of the third transistor T3 may implement a third semiconductor pattern.

Figure 8:
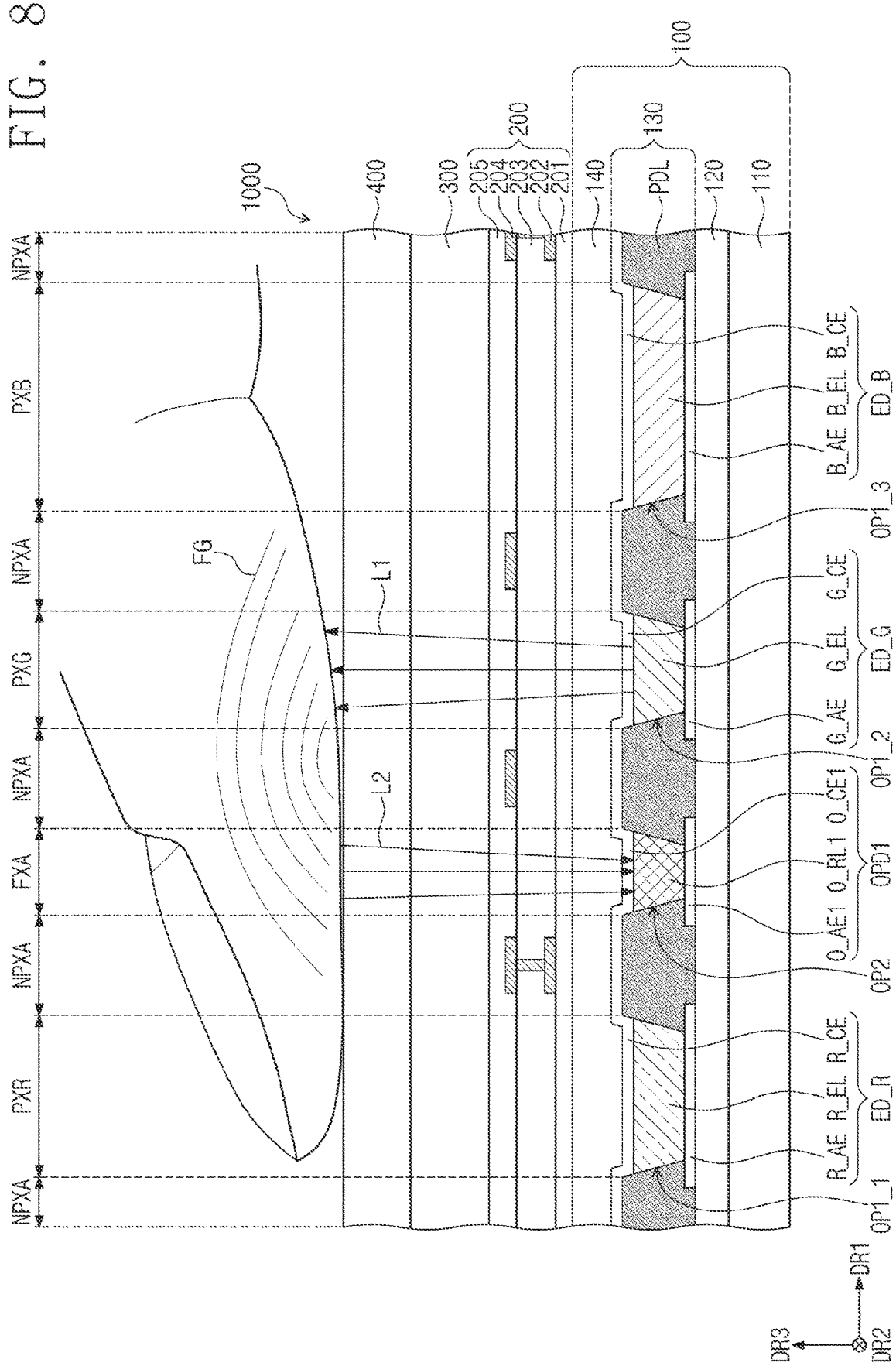
FIG. 8 is a cross-sectional view of an electronic device according to an embodiment of the present disclosure.

The circuit layer 120 may include a semiconductor pattern of the sensor driving circuit O_SD (see FIG. 6). FIG. 8 is a cross-sectional view corresponding to a reset transistor ST1 of a semiconductor pattern of the sensor driving circuit O_SD (see FIG. 6). A source electrode SS1, an active SA1, and a drain electrode SD1 of the reset transistor ST1 may be formed from the second semiconductor pattern layer. The source electrode SS1, the active SA1, and the drain electrode SD1 of the reset transistor ST1 may implement a semiconductor pattern of the reset transistor ST1. Accordingly, the second semiconductor pattern layer may include the third semiconductor pattern and the semiconductor pattern of the reset transistor ST1.

The fourth insulating layer 40 may be disposed on the third insulating layer 30. The fourth insulating layer 40 may cover a second semiconductor pattern layer. In other words, the fourth insulating layer 40 may cover the third semiconductor pattern of the third transistor T3 and the semiconductor pattern of the reset transistor ST1.

The third gate electrode G3 of the third transistor T3 and the gate electrode SG1 of the reset transistor ST1 may be disposed on the fourth insulating layer 40. The third gate electrode G3 may be overlapped with the third active A3 when viewed in a plan view, and the gate electrode SG1 of the reset transistor ST1 may overlap with the active SA1 of the reset transistor ST1 when viewed in a plan view According to an embodiment, the third gate electrode G3 or the gate electrode SG1 of the reset transistor ST1 may be provided in the form of a single electrode or the form of two electrodes.

The fifth insulating layer 50 may be disposed on the fourth insulating layer 40 to cover the third gate electrode G3 and the gate electrode SG1 of the reset transistor ST1. The sixth insulating layer 60, the seventh insulating layer 70, and the eighth insulating layer 80 may be sequentially disposed on the fifth insulating layer 50. At least one of the sixth insulating layer 60, the seventh insulating layer 70, or the eighth insulating layer 80 may be provided as an organic layer, and may provide a flat surface to a component disposed above.

The first connection electrode CNE1 may be disposed on the fifth insulating layer 50. The first connection electrode CNE1 may be connected to the connection signal line CSL through a contact hole CH1 formed through the first to fifth insulating layers 10 to 50. The second connection electrode CNE2 may be disposed on the sixth insulating layer 60. The second connection electrode CNE2 may be connected to the first connection electrode CNE1 through a contact hole CH2 formed through the sixth insulating layer 60. The third connection electrode CNE3 may be disposed on the seventh insulating layer 70. The third connection electrode CNE3 may be connected to the second connection electrode CNE2 through a contact hole CH5 formed through the seventh insulating layer 70

The fourth connection electrode CNE1-1 may be disposed on the fifth insulating layer 50. The fourth connection electrode CNE1-1 may be connected to the drain electrode SD1 of the reset transistor ST1 through a contact hole CH3 formed through the fourth and fifth insulating layers 40 and 50. The fifth connection electrode CNE2-1 may be disposed on the sixth insulating layer 60. The fifth connection electrode CNE2-1 may be connected to the fourth connection electrode CNE1-1 through a contact hole CH4 formed through the sixth insulating layer 60 The sixth connection electrode CNE3-1 may be disposed on the seventh insulating layer 70. The sixth connection electrode CNE3-1 may be connected to the fifth connection electrode CNE2-1 through a contact hole CH8 formed through the seventh insulating layer 70

According to an embodiment of the present disclosure, at least one of the fifth to seventh insulating layers 50 to 70 may be omitted. Accordingly, at least one of the first to third connection electrodes CNE1 to CNE3 and the fourth to sixth connection electrodes CNE1-1 to CNE3-1 may be omitted.

The readout line RLd may be disposed on the sixth insulating layer 60 The readout line RLd may be disposed in a layer the same as that of the second and fifth connection electrodes CNE2 and CNE2-1. The readout line RLd may be covered by the seventh insulating layer 70. According to an embodiment, the readout line RLd may be disposed in a layer the same as that of the data line DLi (see FIG. 5). However, the layer in which the readout line RLd is disposed is not limited thereto.

The eighth insulating layer 80 may be disposed on the seventh insulating layer 70 to cover the third and sixth connection electrodes CNE3 and CNE3-1. The eighth insulating layer 80 may provide a base surface on which the light emitting element layer 130 is disposed.

The light emitting element layer 130 may be disposed on the circuit layer 120. The light emitting element layer 130 may include a light emitting element ED_R, the sensing element OPD, and a pixel defining layer PDL. Although FIG. 8 illustrates that the first light emitting element ED_R is disposed in the first pixel region PXR and the sensing element OPD is disposed adjacent thereto, the description thereof may be identically applied to other light emitting elements and other sensing elements included in the display panel DP.

The first light emitting element ED_R may include a first electrode R_AE, a light emitting layer R_EL, and a second electrode R_CE. FIG. 7 illustrates the first light emitting element ED_R of the light emitting elements OLED (see FIG. 6). The first light emitting element ED_R may include an organic light emitting element, a quantum dot light emitting element, a micro-LED light emitting element, or a nano-LED light emitting element. However, the embodiment is not limited thereto, and the first light emitting element ED_R may include various embodiments as long as light may be generated or an amount of light may be controlled in response to an electrical signal.

The sensing element OPD may include a sensing anode electrode O_AE, a photoelectric conversion layer O_RL, and a sensing cathode electrode O_CE. The sensing element OPD may be disposed adjacent to the first light emitting element ED_R in the active region DA (see FIG. 4). The sensing element OPD may be an optical sensor which senses light incident toward the sensing element OPD and converts an optical signal into an electrical signal. For example, the sensing element OPD may be a photodiode. In an embodiment, the sensing element OPD is disposed in a layer the same as a layer of the first light emitting element ED_R.

The first electrode R_AE and the sensing anode electrode O_AE may be disposed on the eighth insulating layer 80 which is the same layer. The first electrode R_AE and the sensing anode electrode O_AE may be spaced apart from each other, when viewed in a plan view.

The first electrode R_AE may be connected to the third connection electrode CNE3 through a contact hole CH7 formed through the eighth insulating layer 80. The first electrode R_AE may be electrically connected to the connection signal line CSL through the first to third connection electrodes CNE1 to CNE3.

The sensing anode electrode O_AE may be connected to the sixth connection electrode CNE3-1 through a contact hole CH8 formed through the eighth insulating layer 80. The sensing anode electrode O_AE may be electrically connected to the drain electrode SD1 of the reset transistor ST1 through the fourth to sixth connection electrodes CNE1-1 to CNE3-1.

The pixel defining layer PDL may be disposed on the eighth insulating layer 80. A light emitting opening OP1 exposing at least a portion of the first electrode R_AE of the first light emitting element ED_R may be defined in the pixel defining layer PDL. A portion of the first electrode R_AE exposed by the light emitting opening OP1 may correspond to the first pixel region PXR. A light receiving opening OP2 exposing at least a portion of the sensing anode electrode O_AE may be defined in the pixel defining layer PDL. A portion of the sensing anode electrode O_AE exposed by the light receiving opening OP2 may correspond to the light receiving region FXA. The peripheral region NPXA may surround the first pixel region PXR and the light receiving region FXA.

The pixel defining layer PDL may include a polymer resin. For example, the pixel defining layer PDL may include polyacrylate-based resin or polyimide-based resin. The pixel defining layer PDL may further include an inorganic material in addition to a polymer resin. In addition, the pixel defining layer PDL may include an inorganic material. For example, the pixel defining layer PDL may include a silicon nitride (SiNx), a silicon oxide (SiOx), or a silicon nitrate (SiOxNy).

The pixel defining layer PDL may include a light absorbing material. The pixel defining layer PDL may include a black coloring agent. The black coloring agent may include a black dye and a black pigment. The black coloring agent may include carbon black, metal, such as chromium, or oxides thereof. However, the embodiment is not limited thereto.

The light emitting layer R_EL may be interposed between the first electrode R_AE and the second electrode R_CE. The light emitting layer R_EL may be disposed in a region corresponding to the light emitting opening OP1. The light emitting layer R_EL may include an organic light emitting material and/or an inorganic light emitting material. For example, the light emitting layer R_EL may include a fluorescent or phosphorescent material, a metal organic complex light emitting material, or a quantum dot. The light emitting layer R_EL may emit any one of red, green, and blue color lights. FIG. 7 illustrates an light emitting layer R_EL which emits a red color light.

The first driving voltage ELVDD (see FIG. 6) and the second driving voltage ELVSS (see FIG. 6) are applied to the first electrode R_AE and the second electrode R_CE, respectively, and holes and electrons injected into the light emitting layer R_EL may be combined with each other to form excitons. As the exciton transitions to be in the ground state, the first light emitting element ED_R may emit a light, and an image may be displayed through the active region DA (see FIG. 4).

A photoelectric conversion layer O_RL may be interposed between the sensing anode electrode O_AE and the sensing cathode electrode O_CE. The photoelectric conversion layer O_RL may be disposed in a region corresponding to the light receiving opening OP2. The photoelectric conversion layer O_RL may include a light receiving material which receives light and converts the light into an electrical signal. The photoelectric conversion layer O_RL may include an organic light receiving material. For example, the photoelectric conversion layer O_RL may include a conjugated polymer. The photoelectric conversion layer O_RL may include a thiophene-based conjugated polymer, a benzodithiophene-based conjugated polymer, a thieno[3,4-c]pyrrole-4, a 6-dion (TPD)-based conjugated polymer, a diketopyrrole (DPP)-based conjugated polymer, or a benzothiazole (BT)-based conjugated polymer. However, the material of the photoelectric conversion layer O_RL is not limited to the above example.

The second electrode R_CE of the first light emitting element ED_R and the sensing cathode electrode O_CE of the sensing element OPD may be provided in the form of a common electrode C_CE which is integrally connected. In other words, the second electrode R_CE may correspond to a portion, which overlaps with the first electrode R_AE, of the common electrode C_CE, and the sensing cathode electrode O_CE may correspond to a portion, which overlaps with the sensing anode electrode O_AE, of the common electrode C_CE. The common electrode C_CE is provided as a common layer and may overlap with the first pixel region PXR, the light receiving region FXA, and the peripheral region NPXA.

Each of the first electrode R_AE, the sensing anode electrode O_AE, and the common electrode C_CE may include at least one selected from Ag, Mg, Cu, Al, Pt, Pd, Au, Ni, Nd, Ir, Cr, Li, Ca, LiF, Mo, Ti, W, In, Sn, and Zn, a compound of at least two materials selected from the above materials, a mixture of at least two materials selected from the above materials, or an oxide thereof.

Each of the first electrode R_AE, the sensing anode electrode O_AE, and the common electrode C_CE may be a transmissive electrode, a semi-transmissive electrode, or a reflective electrode. The transmissive electrode may include, for example, an indium tin oxide (ITO), an indium zinc oxide (IZO), a zinc oxide (ZnO), or an indium tin zinc oxide (ITZO). The semi-transmissive electrode or the reflective electrode may include Ag, Mg, Cu, Al, Pt, Pd, Au, Ni, Nd, Ir, Cr, Li, Ca, LiF/Ca (the stack structure of LiF and Al), LiF/Al (the stack structure of LiF and Al), Mo, Ti, Yb, W, or the compound or the mixture (e.g., AgMg, AgYb, or MgYb) including the above materials.

The first electrode R_AE, the sensing anode electrode O_AE, and the common electrode C_CE may have a multi-layer structure including a reflective layer or a semi-transmissive layer including the above materials, and a transmissive conductive layer including indium tin oxide (ITO), indium zinc oxide (IZO), zinc oxide (ZnO), and indium tin zinc oxide (ITZO). For example, the electrodes having the multi-layer structure may have a three-layer structure of ITO/Ag/ITO, but the present disclosure is not limited thereto.

The encapsulation layer 140 may be disposed on the light emitting element layer 130 to encapsulate the first light emitting element ED_R and the sensing element OPD. The thin films of the encapsulation layer 140 may include at least one thin film to increase the optical efficiency of the devices of the light emitting element layer 130 or to protect the devices.

According to an embodiment, the encapsulation layer 140 may include a plurality of inorganic layers and at least one organic layer disposed between the inorganic layers. The inorganic layer may protect the devices from moisture and/or oxygen. For example, the inorganic layer may include at least one of aluminum oxide, titanium oxide, silicon oxide, silicon nitride, silicon oxynitride, zirconium oxide, and hafnium oxide. The organic layer may protect devices from foreign substances such as dust particles. For example, the organic layer may include an acrylic-based resin.

FIG. 8 is a cross-sectional view of an electronic device according to an embodiment of the present disclosure.

Referring to FIG. 8, the light emitting element OLED (see FIG. 6) may include first to third light emitting elements ED_R, ED_G, and ED_B. The light emitting element layer 130 may include the first to third light emitting elements ED_R, ED_G, ED_B, and the sensing element OPD1 disposed on the circuit layer 120. Each of the first to third light emitting elements ED_R, ED_G, and ED_B may include the first electrodes R_AE, G_AE, and B_AE, light emitting layer R_EL and G_EL, and second electrode R_CE and G_CE, respectively. The sensing element OPD1 may include a sensing anode electrode O_AE1, a photoelectric conversion layer O_RL1, and a sensing cathode electrode O_CE1.

The first to third light emitting openings OP1_1, OP1_2, and OP1_3 and the light receiving opening OP2 may be defined in the pixel defining layer PDL. The first to third light emitting elements ED_R, ED_G, and ED_B may be disposed corresponding to the first to third light emitting openings OP1_1, OP1_2, and OP1_3, respectively. The sensing element OPD1 may be disposed to correspond to the light receiving opening OP2.

The first electrodes R_AE, G_AE, and B_AE and the sensing anode electrode O_AE may be disposed to be spaced apart from each other in the same layer. The first electrodes R_AE, G_AE, and B_AE and the sensing anode electrode O_AE1 may be simultaneously formed through the same process. At least a portion of each of the first electrodes R_AE, G_AE, and B_AE may be exposed by the first to third light emitting openings OP1_1, OP1_2, and OP1_3, respectively. At least a portion of the sensing anode electrode O_AE1 may be exposed by the light receiving opening OP2.

The regions in which the first to third light emitting elements ED_R, ED_G, and ED_B are disposed may correspond to the first to third pixel regions PXR, PXG, and PXB, respectively. Colors of lights emitted through the first to third pixel regions PXR, PXG, and PXB may be different from each other. The peripheral region NPXA may surround the first to third pixel regions PXR, PXG, and PXB, may set a boundary between the first to third pixel regions PXR, PXG, and PXB, and may prevent colors from being mixed between the first to third pixel regions PXR, PXG, and PXB.

A region in which the sensing element OPD1 is disposed may correspond to the light receiving region FXA. The peripheral region NPXA may surround the light receiving region FXA. The light receiving region FXA surrounded by the peripheral region NPXA may be distinguished from the first to third pixel regions PXR, PXG, and PXB.

The light emitting layers R_EL, G_EL, and B_EL of the first to third light emitting elements ED_R, ED_G, and ED_B may be disposed in the first to third light emitting openings OP1_1, OP1_2, and OP1_3, respectively. In other words, the light emitting layers R_EL, G_EL, and B_EL of the first to third light emitting elements ED_R, ED_G, and ED_B may be formed in a pattern separated from each other. Each of the light emitting layers R_EL, G_EL, and B_EL includes an organic material and/or an inorganic material, and may generate predetermined color light. In addition, the light emitting layers R_EL, G_EL, and B_EL may have a multi-structure referred to as a tandem.

The light emitting layers R_EL, G_EL, and B_EL of the first to third light emitting elements ED_R, ED_G, and ED_B may generate mutually different color lights. However, embodiments of the disclosure are not limited thereto. For example, the light emitting layers R_EL, G_EL, and B_EL of the first to third light emitting elements ED_R, ED_G, ED_B may be disposed in common in the first to third pixel regions PXR, PXG, and PXB to generate a blue light or white light which is a source light having the same color.

The photoelectric conversion layer O_RL1 may be disposed in the light receiving opening OP2. The above description may be equally applied to the photoelectric conversion layer O_RL1.

The second electrodes R_CE, G_CE, and B_CE of the first to third light emitting elements ED_R, ED_G, and ED_B may be electrically connected to each other. For example, the second electrodes R_CE, G_CE, and B_CE of the first to third light emitting elements ED_R, ED_G, and ED_B may have an integral shape. The second electrodes R_CE, G_CE, and B_CE may have an integral shape with the sensing cathode electrode O_CE1 of the sensing element OPD1. Accordingly, the second electrodes R_CE, G_CE, B_CE and the sensing cathode electrode O_CE1 may be integrally connected to each other to be provided as common electrodes C_CE (see FIG. 7) overlapped with the first to third pixel regions PXR, PXG, PXB, NPXA, and the light receiving region FXA.

The sensor layer 200 may be directly disposed on the encapsulation layer 140. However, the present disclosure is not limited thereto. For example, the sensor layer 200 may be coupled to the encapsulation layer 140 through a separate adhesive layer.

The sensor layer 200 may include a base layer 201, a first conductive layer 202, a sensing insulating layer 203, a second conductive layer 204, and a cover insulating layer 205.

The base layer 201 may be an inorganic layer including at least one of silicon nitride, silicon oxynitride, or silicon oxide. Alternatively, the base layer 201 may be an organic layer including an epoxy resin, an acrylic resin, or an imide-based resin. The base layer 201 may have a single-layer structure or a multi-layer structure including layers stacked in the third direction DR3.

Each of the first conductive layer 202 and the second conductive layer 204 may have a single-layer structure or a multi-layer structure including the layers stacked in the third direction DR3.

The conductive layer in a single layer structure may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), or indium zinc tin oxide (IZTO). In addition, the transparent conductive layer may include a conductive polymer such as poly (3,4-ethylenedioxythiophene) (PEDOT), metal nanowires, or graphene.

The conductive layer in the multi-layer structure may include metal layers. The metal layers may have, for example, a three-layer structure of titanium/aluminum/titanium. The conductive layer in the multi-layer structure may include at least one metal layer and at least one transparent conductive layer.

At least one of the sensing insulating layer 203 and the cover insulating layer 205 may include an inorganic layer. The inorganic layer may include at least one of an aluminum oxide, a titanium oxide, a silicon oxide, a silicon nitride, a silicon oxynitride, a zirconium oxide, or a hafnium oxide.

At least one of the sensing insulating layer 203 and the cover insulating layer 205 may include an organic layer. The organic layer may include at least one of an acrylic resin, a methacrylic resin, a polyisoprene, a vinyl resin, an epoxy resin, a urethane resin, a cellulose resin, a siloxane resin, a polyimide resin, a polyamide resin, or a perylene resin.

The anti-reflection layer 300 and the window 400 may be sequentially stacked on the cover insulating layer 205. For example, the anti-reflection layer 300 may formed on the cover insulating layer 205 and the window 400 may be formed on the anti-reflection layer 300.

Each of the first to third light emitting elements ED_R, ED_G, and ED_B may output light. For example, the first light emitting element ED_R may output a red light in a red wavelength band, the second light emitting element ED_G may output a green light in a green wavelength band, and the third light emitting element ED_B may output blue light in the blue wavelength band.

The light L1 may be provided toward the biometric information FG during the first time. For example, the first time may be 100 millisecond (ms). For example, the light L1 may be applied to a finger of a user of a fingerprint of the finger.

The sensing element OPD1 may receive a light obtained by reflecting lights of the first to third light emitting elements ED_R, ED_G, and ED_B. In other words, the sensing element OPD1 may receive a reflection light L2 obtained by reflecting a light L1, which is output from at least one of the first to third light emitting elements ED_R, ED_G, and ED_B, from the biometric information of the user. The biometric information FG may be a fingerprint. For example, the light L1 may reflect off the finger or the fingerprint to generate the reflection light L2.

The sensing element OPD1 may generate optical charges corresponding to the reflection light L2 from the ridge of the biometric information FG or the valley between the ridges The sensing element OPD1 may generate first sensing signals S_FS (see FIG. 4) based on the optical charges.

The sensor driving circuit 100C5 (see FIG. 4) may process the first sensing signals S_FS (see FIG. 4) and provide the processed first sensing signals S_FS (see FIG. 4) to the signal control circuit 100C1 (see FIG. 4). The signal control circuit 100C1 (see FIG. 4) may acquire an external image based on the first sensing signals S_FS.

Figure 9:
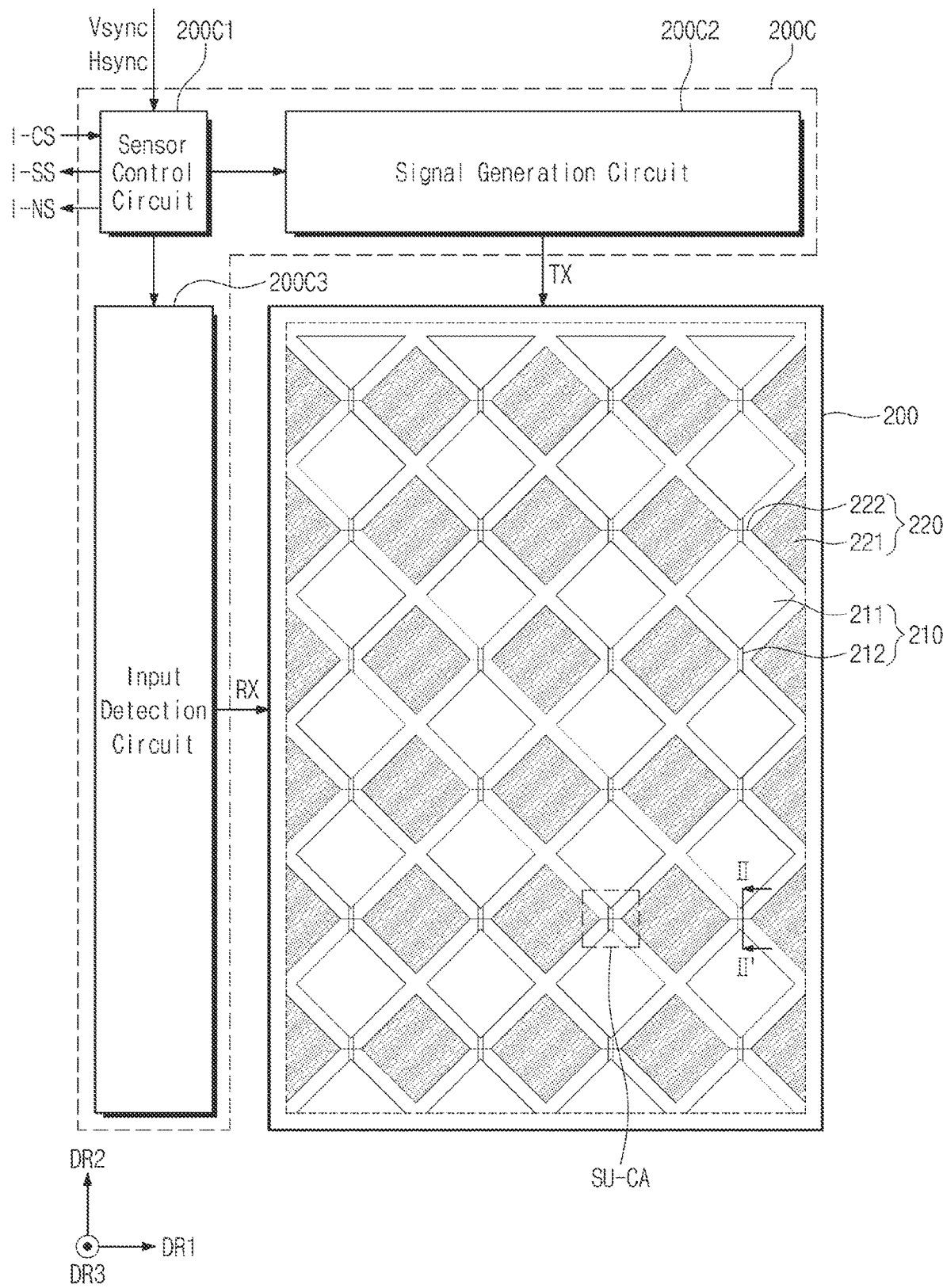
FIG. 9 is a block diagram of a sensor layer and a sensor driving unit according to an embodiment of the present disclosure.

FIG. 9 is a block diagram of a sensor layer and a sensor driving unit according to an embodiment of the present disclosure.

Referring to FIG. 9, the sensor layer 200 may include a plurality of first electrodes 210 and a plurality of second electrodes 220 The plurality of second electrodes 220 may cross the plurality of first electrodes 210. The sensor layer 200 may further include a plurality of signal lines connected to the plurality of first electrodes 210 and the plurality of second electrodes 220.

Each of the plurality of first electrodes 210 may include a sensing pattern 211 and a bridge pattern 212. The two sensing patterns 211 adjacent to each other may be electrically connected to each other through two bridge patterns 212, but the present disclosure is specifically not limited thereto. The two bridge patterns 212 may be insulated from two parts 222 while crossing the second parts 222.

Each of the plurality of second electrodes 220 may include a first part 221 and a second part 222. The first part 221 and the second part 222 may have the form in which the first part 221 and the second part 222 are integrated with each other, and may be disposed in the same layer.

The sensor driving unit 200C may receive a control signal I-CS from the main driving unit 1000C (see FIG. 2) and may provide the coordinate signal I-SS or the proximity sensing signal I-NS to the main driving unit 1000C (see FIG. 2).

For example, the sensor driving unit 200C may be implemented in the form of an integrated circuit (IC) and mounted directly in a specific region of the sensor layer 200, or mounted in the form of a chip on film (COF) manner on a separate printed circuit board, such that the sensor driving unit 200C is electrically connected to the sensor layer 200.

The sensor driving unit 200C may include a sensor control circuit 200C1, a signal generation circuit 200C2, and an input detection circuit 200C3. The sensor control circuit 200C1 may receive the vertical synchronization signal Vsync and the horizontal synchronization signal Hsync from the display driving unit 100C. The sensor control circuit 200C1 may control operations of the signal generation circuit 200C2 and the input detection circuit 200C3, based on the control signal I-CS, the vertical synchronization signal Vsync, and the horizontal synchronization signal Hsync.

The signal generation circuit 200C2 may output transmission signals TX to first electrodes 210 of the sensor layer 200. The input detection circuit 200C3 may receive the sensing signals RX from the sensor layer 200. For example, the input detection circuit 200C3 may receive the sensing signals RX from the second electrodes 220.

The input detection circuit 200C3 may convert an analog signal into a digital signal. For example, the input detection circuit 200C3 amplifies and filters the received analog signal. In other words, the input detection circuit 200C3 may convert the filtered signal into a digital signal. The sensitivity of the sensor layer 200 may be determined from the converted digital signal.

Figure 10A:
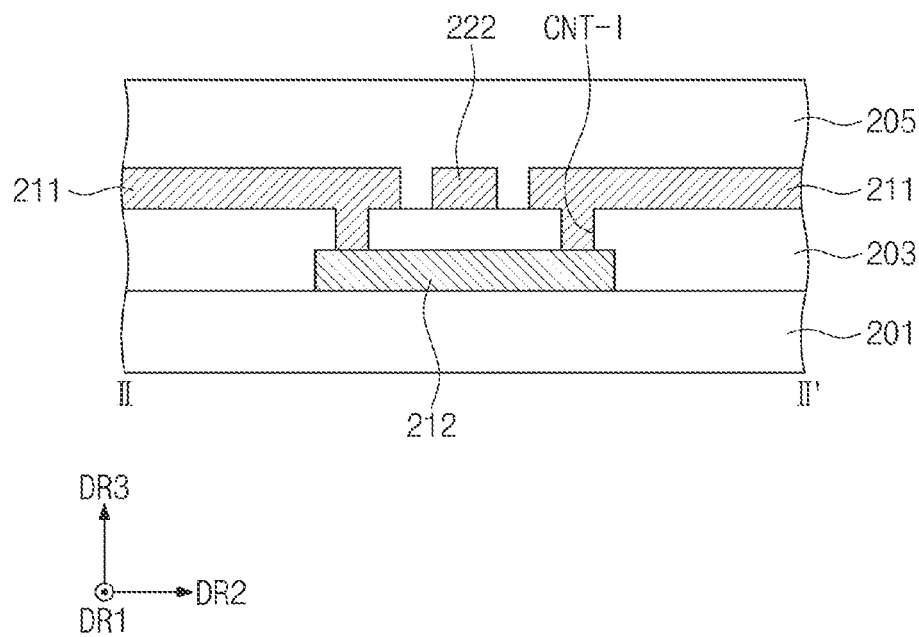
FIG. 10A is a cross-sectional view of a sensor layer taken along line II-II' of FIG. 9 according to an embodiment of the present disclosure.

FIG. 10A is a cross-sectional view of a sensor layer cut along II-II' illustrated in FIG. 9 according to an embodiment of the present disclosure.

Referring to FIGS. 9 and 10A, the sensor layer 200 may have a bottom bridge structure. For example, the bridge pattern 212 may be included in the first conductive layer 202 (see FIG. 8), and the first part 221, the second part 222, and the sensing pattern 211 may be included in the second conductive layer 204 (see FIG. 8). The sensing pattern 211 may be connected to the bridge pattern 212 through the contact hole CNT-I formed through the sensing insulating layer 203.

Figure 10B:
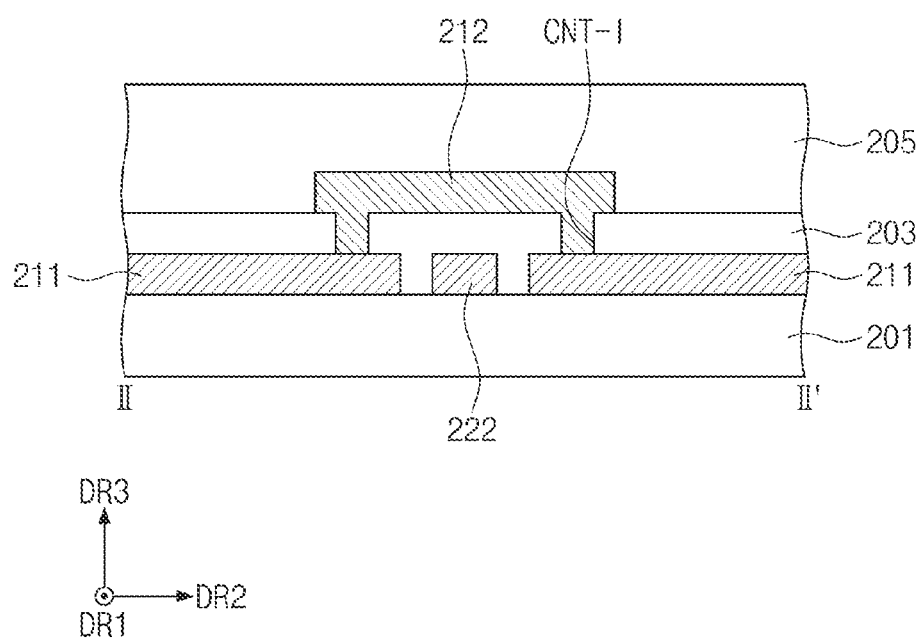
FIG. 10B is a cross-sectional view of a sensor layer taken along line II-II' of FIG. 9 according to an embodiment of the present disclosure.

FIG. 10B is a cross-sectional view taken along line II-II' of FIG. 9, according to an embodiment of the present disclosure.

Referring to FIGS. 9 and 10B, the sensor layer 200 may have a top-bridge structure. For example, the bridge pattern 212 may be included in the second conductive layer 204 (see FIG. 8), and the first part 221, the second part 222, and the sensing pattern 211 may be included in the second conductive layer 202 (see FIG. 8). The sensing pattern 212 may be connected to the bridge pattern 211 through the contact hole CNT-I formed through the sensing insulating layer 203. The second part 222 may be disposed between portions of the sensing pattern 211. The bridge pattern 212 may connect the portions of the sensing pattern 211.

Figure 11:
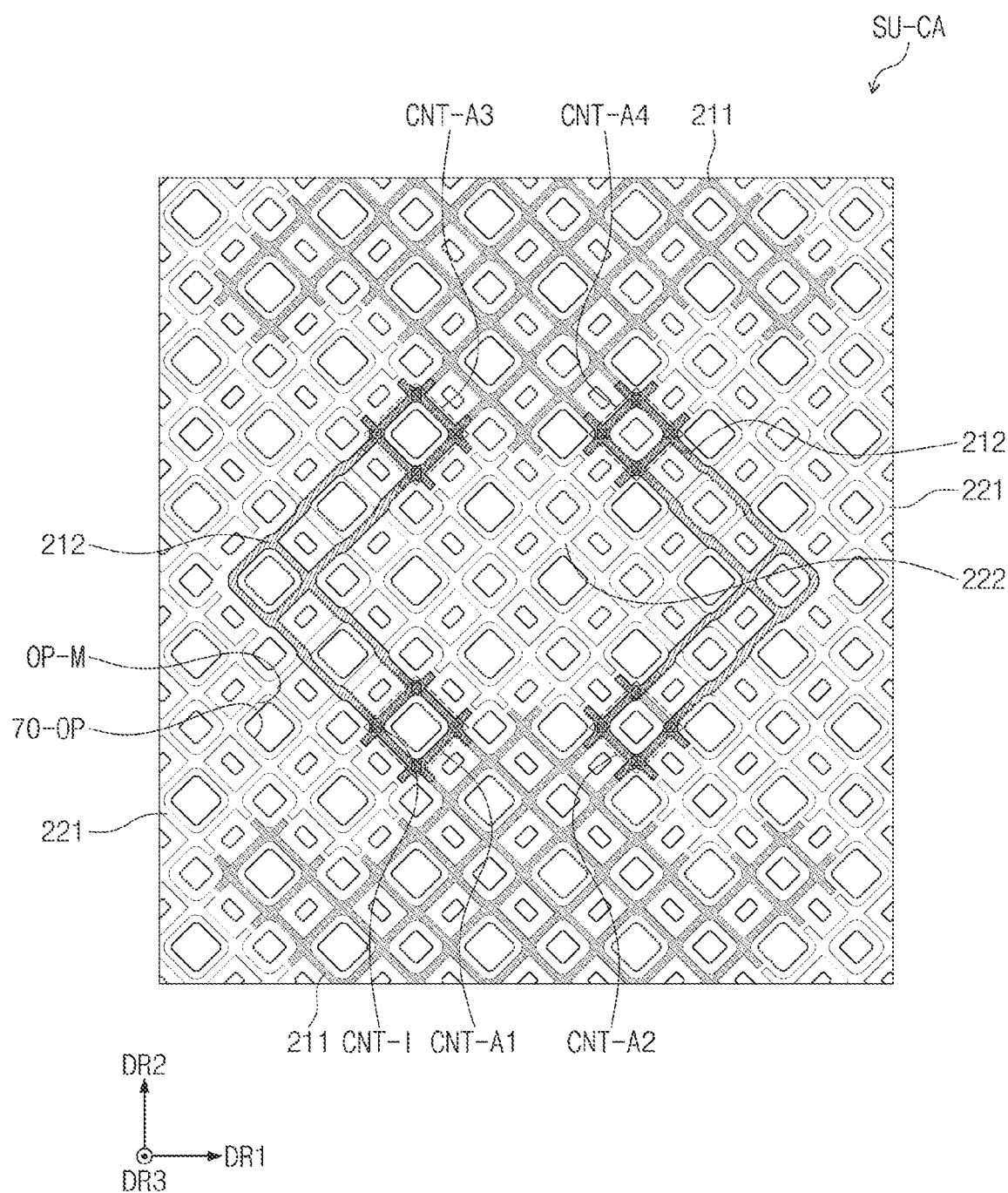
FIG. 11 is an enlarged plan view illustrating a crossing region of a sensor layer according to an embodiment of the present disclosure.

FIG. 11 is an enlarged plan view illustrating a crossing region of a sensor layer (e.g., 200) according to an embodiment of the present disclosure.

Referring to FIG. 11, the crossing region SU-CA may be a region in which the bridge patterns 212 are disposed.

The sensing pattern 211 may have a mesh structure. An opening OP-M may be present in the sensing pattern 211. One opening OP-M may overlap with an opening part 70-OP present in the pixel defining layer PDL (see FIG. 7). However, this is merely provided for illustrative purpose, and one opening OP-M may be overlap with the plurality of opening parts 70-OP. Each of the bridge pattern 212, the first part 221, and the second part 222 may have a mesh structure similar to a mesh structure of the sensing pattern 211.

Two bridge patterns 212 may connect two sensing patterns 211 to each other. First to fourth connection regions CNT-A1 to CNT-A4 are interposed between the two bridge patterns 212 and the two sensing patterns 211. Four contact holes CNT-I may be formed in each of the first to fourth connection regions CNT-A1 to CNT-A4. However, this is provided merely for illustrative purpose, and the two sensing patterns 211 may be electrically connected to each other through one bridge pattern. In addition, according to another embodiment of the present disclosure, the two sensing patterns 211 may be electrically connected to each other by three or more bridge patterns.

Figure 12:
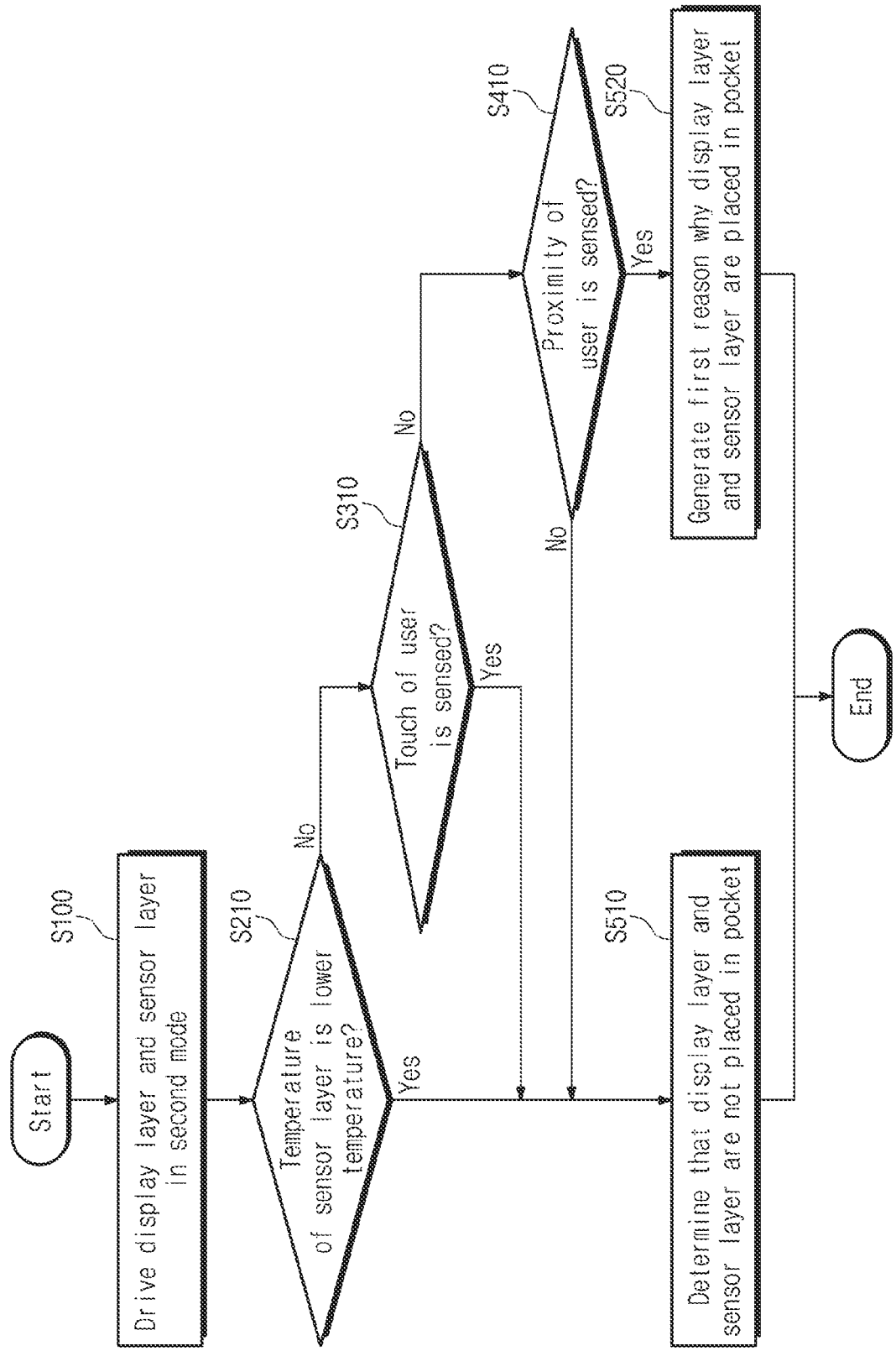
FIG. 12 is a flowchart illustrating a method for driving an electronic device according to an embodiment of the present disclosure.
Figure 13:
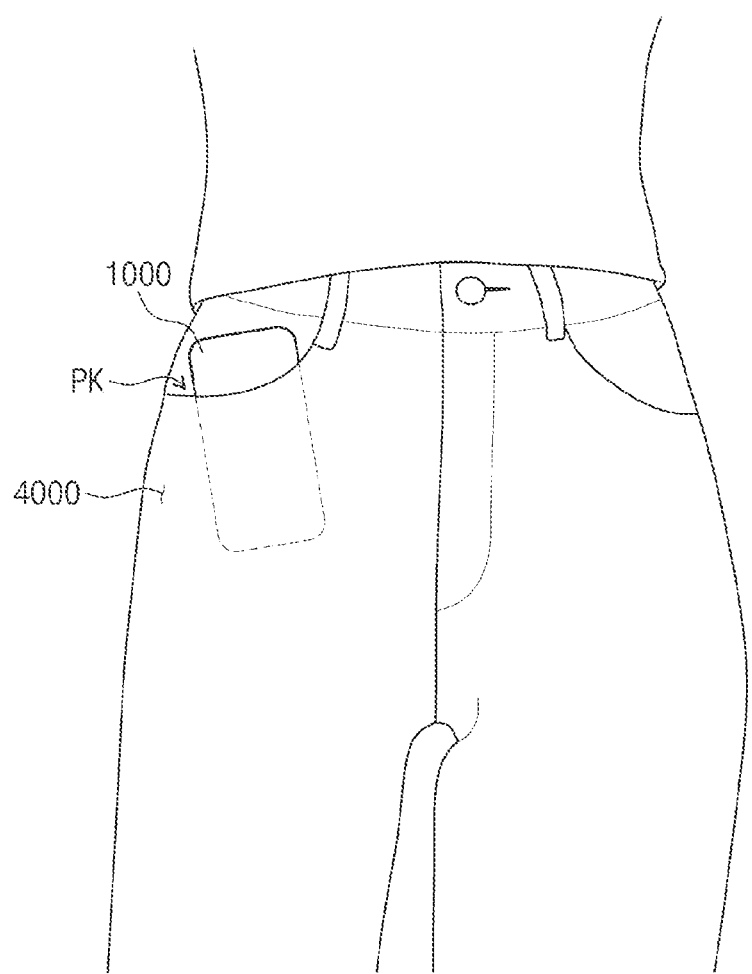
FIG. 13 is a view illustrating that an electronic device is placed in a pocket of a user according to an embodiment of the present disclosure.

FIG. 12 is a flowchart illustrating a method for driving an electronic device according to an embodiment of the present disclosure, and FIG. 13 is a view illustrating that an electronic device is placed in a pocket of a user according to an embodiment of the present disclosure.

Referring to FIGS. 12 and 13, an electronic device 1000 may be placed in a pocket PK of user clothes 4000. In this case, the main driving unit 1000C (see FIG. 2) may be switched from a first mode MD1 (see FIG. 15), which is an existing state, to operate in a second mode MD2 (see FIG. 15) for determining whether the electronic device 100 is placed in the pocket PK. In this case, the electronic device 1000 may drive the display layer 100 (see FIG. 2) and the sensor layer 200 (see FIG. 2) in the second mode MD2 (see FIG. 15) (S100). According to an embodiment of the present disclosure, the user clothes 4000 may be referred to as a thing 4000 or an object 4000.

Figure 14:
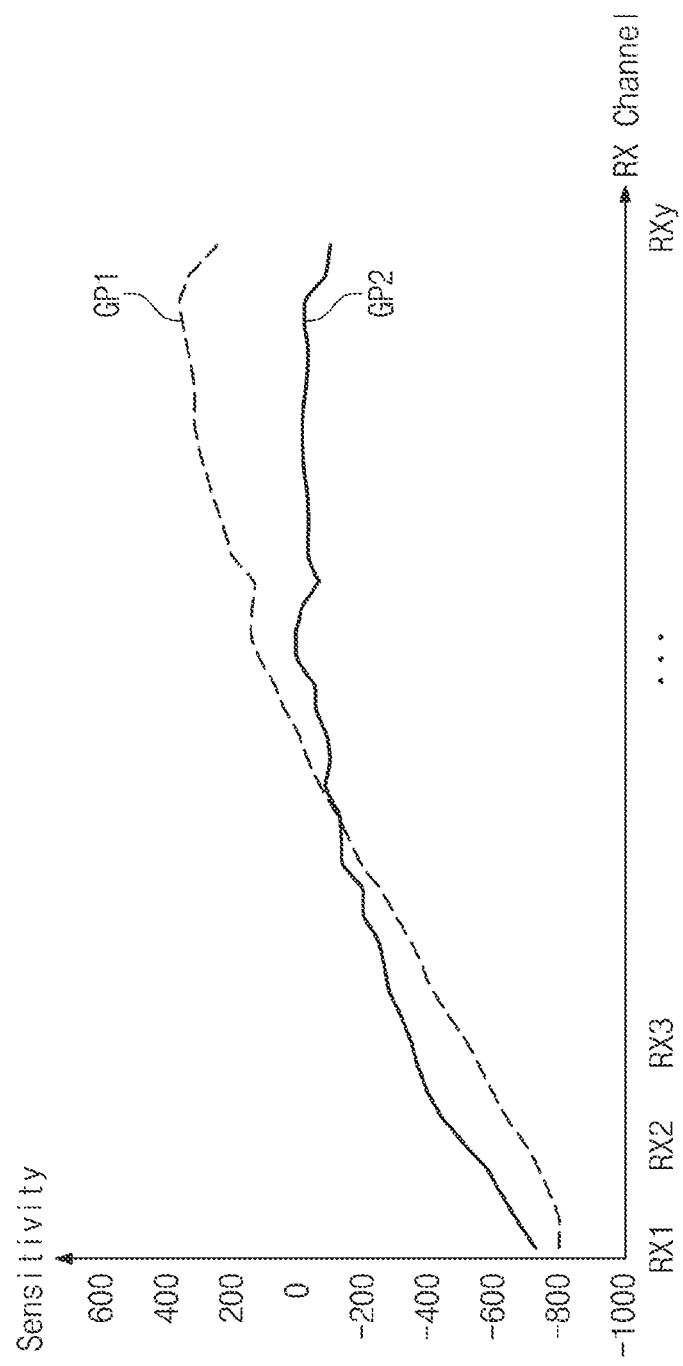
FIG. 14 is a graph illustrating the sensitivity of a capacitance measured with respect to each of a plurality of second electrodes for each temperature according to an embodiment of the present disclosure.

FIG. 14 is a graph illustrating the sensitivity of a capacitance measured with respect to each of a plurality of second electrodes (e.g., 220) for each temperature according to an embodiment of the present disclosure.

Referring to FIGS. 2, 12, and 14, when the electronic device 1000 is placed in the pocket PK (see FIG. 13), and when the electronic device 1000 is exposed to the external environment, the temperature of the electronic device 1000 may be relatively increased. When the electronic device 1000 is placed in in the pocket PK (see FIG. 13) of a user for a specific time, the temperature of the electronic device 1000 may be maintained at a specific level or more. For example, when the electronic device is placed in the pocket PK, the temperature may increase to a certain value and then maintain that certain value for a certain period of time.

The sensing signals RX of the sensor layer 200 may have varying sensitivities depending on temperature. The main driving unit 1000C may determine the temperature of the electronic device 1000 by using sensitivities varied depending on temperature. In this case, it may be determined whether the temperature of the sensor layer 200 is a lower temperature (S210). For example, it may be determine whether the temperature is below a certain value.

In the second mode MD2 (see FIG. 15), the main driving unit 1000C may receive a signal including sensing signals RX received from a plurality of second electrodes 220 from the sensor driving unit 200C. The main driving unit 1000C may determine whether the sensing signals RX satisfy a specific condition. The condition may include the sensitivity of the sensor layer 200 The sensitivity may be a signal obtained by converting a signal, which is filtered by the input detection circuit 200C3 (see FIG. 9), into a digital signal. For example, the sensitivity may be obtained from the digital signal. However, this is provided merely for illustrative purpose, and the condition according to an embodiment of the present disclosure is not limited thereto. For example, the condition may include the measured capacitance.

The memory MM may store a first characteristic of a capacitance measured in the sensor layer 200 at a first temperature and a second characteristic of the capacitance measured in the sensor layer 200 at a second temperature higher than the first temperature The first temperature may be referred to as a lower temperature, and the second temperature may be referred to as a higher temperature.

When the capacitance measured by the sensor layer 200 is matched to or corresponds to the first characteristic, the main driving unit 1000c may determine that the electronic device 1000 is not placed in the pocket PK of the user (see FIG. 13) (S510). In other words, when the temperature of the sensor layer 200 is determined as being a lower temperature, it may be determined that the electronic device 1000 is not placed in the pocket PK of the user (see FIG. 13) (S510).

The memory MM may further store a first graph GP1 corresponding to the first characteristic and a second graph GP2 corresponding to the second characteristic.

The first graph GP1 may illustrate the sensitivity of the capacitance for each of the sensing signals RX1, RX2, RX3, . . . and RXy which are received by the plurality of second electrodes 220 at the first temperature.

The second graph GP2 may illustrate the sensitivity of the capacitance for each of the sensing signals RX1, RX2, RX3, . . . and RXy which are received by the plurality of second electrodes 220 at the second temperature.

A graph obtained by measuring the sensitivity of mutual capacitance for the plurality of second electrodes 220 arranged in a direction opposite to the second direction DR2 may have a larger slope as the temperature is decreased. The sensor driving unit 200C may determine the temperature of the electronic device 1000 (see FIG. 1) based on the sensitivity received from the sensing signals RX, even when the separate temperature sensor is not used.

In an embodiment, a first slope of the first graph GP1 is greater than a second slope of the second graph GP2.

When the slope of a graph showing the sensitivity of the capacitance measured with respect to each of a plurality of second electrodes 220 in the sensor layer 200 is greater than or equal to the first slope of the first graph GP1 stored in the memory MM, the main driving unit 1000C may determine that the electronic device 1000 is not placed in the pocket PK of the user (see FIG. 13) (S510). In other words, when the temperature of the sensor layer 200 is determined as being a lower temperature, it may be determined that the electronic device 1000 is not placed in the pocket PK of the user (see FIG. 13) (S510).

Figure 15:
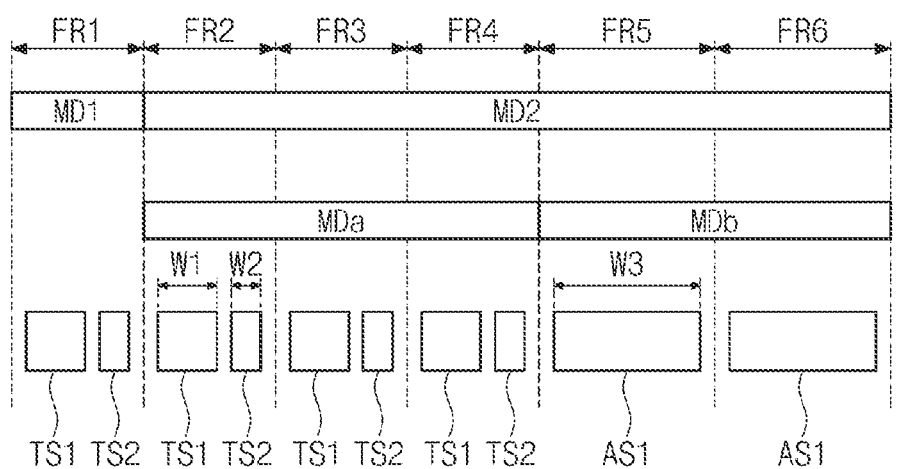
FIG. 15 is a conceptual view illustrating an operation of a sensor driving unit according to an embodiment of the present disclosure.

FIG. 15 is a conceptual view illustrating an operation of a sensor driving unit (e.g., 200c) according to an embodiment of the present disclosure. FIGS. 16A to 16D are conceptual views illustrating an operation of a sensor layer (e.g., 200) according to an embodiment of the present disclosure. FIG. 17 illustrates an electronic device placed in a pocket of a user, according to an embodiment of the present disclosure.

Referring to FIGS. 2, 12, and 15, the display layer 100 may display an image in unit of one frame duration. For example, one frame duration may be defined as a duration from a rising edge to a next rising edge in the vertical synchronization signal Vsync (see FIG. 4). For example, the one frame duration may be a duration from a rising edge of a first pulse of the vertical synchronization signal Vsync to a rising edge of a second pulse of the vertical synchronization signal Vsync.

When the operating frequency of the display layer 100 is 60 Hertz (Hz), a time corresponding to one frame duration may be about 16.44 milliseconds (ms). However, this is provided merely for illustrative purpose. The operating frequency according to an embodiment of the present disclosure is not limited thereto. For example, when the operating frequency of the display layer 100 is 120 Hz (Hertz), a time corresponding to one frame duration may be about 8.33 ms. The operating frequency may be referred to as a frame frequency or a report rate.

The sensor driving unit 200C may be operated while an image for one frame duration is displayed on the display layer 100. In other words, the sensor driving unit 200C may be operated in unit of one frame duration.

In a first mode MD1, the sensor driving unit 200C may sense a user touch 2000 for one frame duration FR1 of a plurality of frame durations. The one frame duration FR1 may include a first touch duration TS1 and a second touch duration TS2 that is sequential to the first touch duration TS1.

The first touch duration TS1 may be a duration for sensing the user touch 2000 in a mutual touch manner. The second touch duration TS2 may be a duration for sensing the user touch 2000 in a self-touch manner.

When the slope of a graph showing the sensitivity of the capacitance measured with respect to each of a plurality of second electrodes 220 in the sensor layer 200 is less than the first slope of the first graph GP1 (see FIG. 14) or the second slope of the second graph GP2 (see FIG. 14) stored in the memory MM, the main driving unit 1000C may perform the step of determining the touch state by the user. In other words, when the temperature of the sensor layer 200 is determined to be higher, the step of detecting the touch state of the user in the second mode MD2 may be performed (S310).

In the second mode MD2, the sensor driving unit 200C may operate the sensor layer 200 in a touch sensing mode MDa or a proximity sensing mode MDb. For example, while the main driving unit 1000C senses a user touch (S310), the sensor driving unit 200C may drive the sensor layer 200 in the touch sensing mode MDa. While the main driving unit 1000C senses a user proximity (S410), the sensor driving unit 200C may drive the sensor layer 200 in the proximity sensing mode MDb.

In the touch sensing mode MDa, the sensor driving unit 200C may operate with a plurality of first frame durations FR2, FR3, and FR4 each having a first operating frequency. In an embodiment, the first operating frequency is the same as the operating frequency for the frame duration FR1 in the first mode MD1.

Although FIG. 15 illustrates three first frame durations FR2, FR3, and FR4 in the touch sensing mode MDa, the present disclosure is not limited thereto. For example, the number of frame durations may be provided differently depending on the time of operating in the touch sensing mode MDa.

The plurality of first frame durations FR2, FR3, and FR4 may include the first touch duration TS1 and the second touch duration TS2 that occurs sequentially after the first touch duration TS1. For example, the plurality of first frame durations FR2, FR3, and FR4 may be driven in the same manner as the frame duration FR1 in the first mode MD1.

In an embodiment, the first width W1 of the first touch duration TS1 is greater than the second width W2 of the second touch duration TS2. In other words, the time when the first touch duration TS1 is provided may be longer than the time when the second touch duration TS2 is provided.

Figure 16A:
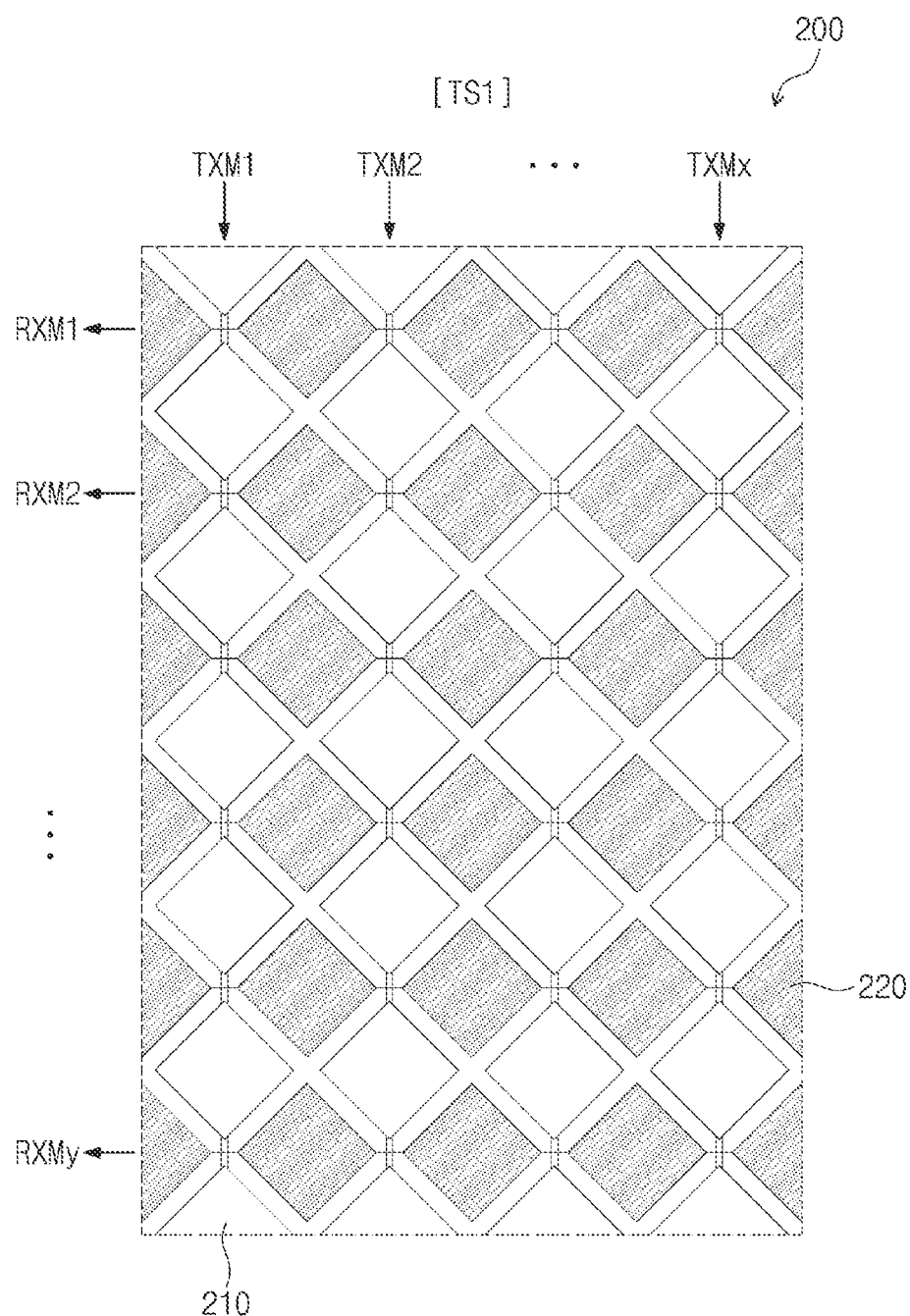
FIGS. 16A to 16D are conceptual views illustrating an operation of a sensor layer according to an embodiment of the present disclosure.
Figure 17:
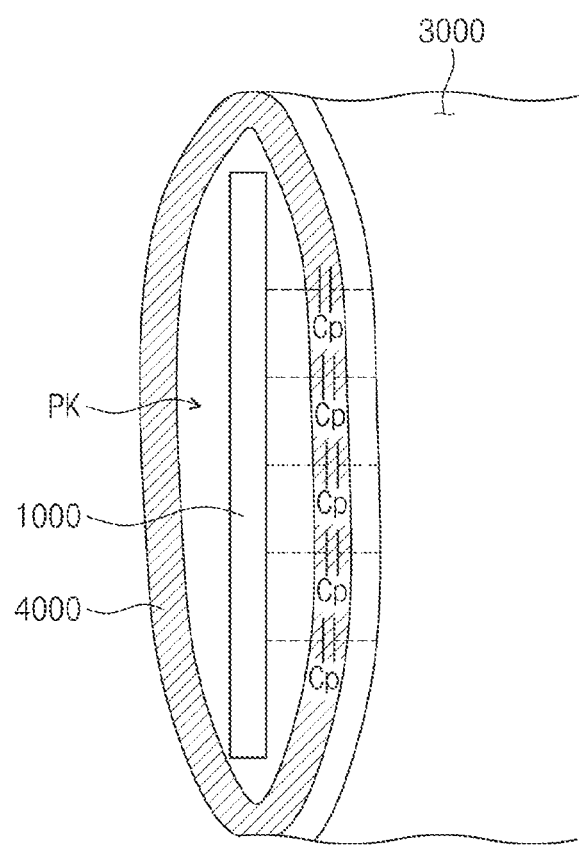
FIG. 17 illustrates an electronic device placed in a pocket of a user according to an embodiment of the present disclosure.

Referring to FIG. 16A, in the first touch duration TS1, the sensor driving unit 200C may output a plurality of transmission signals TXM1, TXM2, . . . , and TXMx (x is an integer equal to or greater than '3') to a plurality of first electrodes 210, and may receive a plurality of sensing signals RXM1, RXM2, . . . , and RXMy (y is an integer equal to or greater than '3') from a plurality of second electrodes 220. For example, the sensing signals RXM1, RXM2, . . . , and RXMy may be received in response to the output of the transmission signals TXM1, TXM2, . . . , and TXMx. In this case, the plurality of transmission signals TXM1, TXM2, . . . , and TXMx may be referred to as transmission signals TX (see FIG. 9). The plurality of sensing signals RXM1, RXM2, . . . , and RXMy may be referred to as the sensing signals RX (see FIG. 9).

The sensor driving unit 200C may output coordinate signals I-SS derived based on the plurality of sensing signals RXM1, RXM2, . . . , and RXMy to the main driving unit 1000C. In an embodiment, a first data amount of the coordinate signal I-SS is less than a second data amount of the proximity sensing signal I-NS. For example, a size of the first data amount may be less than a size of the second data amount.

Each of the plurality of transmission signals TXM1, TXM2, . . . , and TXMx may have a first voltage. For example, the first voltage may be 6 volts (V), but is not limited thereto.

Each of the plurality of transmission signals TXM1, TXM2, . . . , and TXMx may have a first frequency. For example, the first frequency may be 332 kHz, but is not limited thereto.

The sensor layer 200 may sense an input by the touch 2000 of the user body by capacitively coupling a plurality of first electrodes 210 with a plurality of second electrodes 220. In this case, the sensor layer 200 may operate in a mutual touch manner.

Figure 16B:
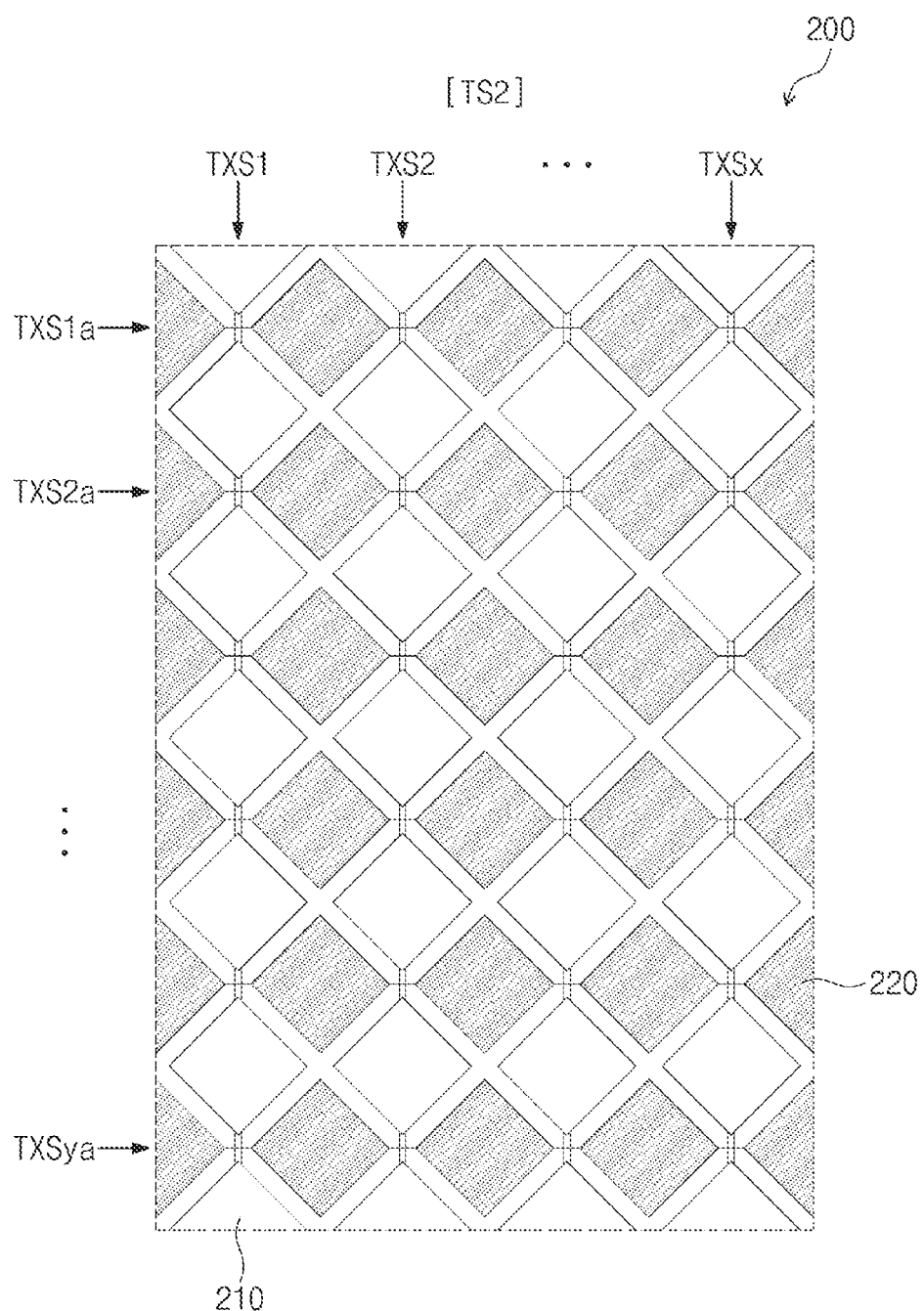

Referring to FIG. 16B, in the second touch duration TS2, the sensor driving unit 200C may output a plurality of first transmission signals TXS1, TXS2, . . . , and TXSx to the plurality of first electrodes 210, and may receive a plurality of second transmission signals TXS1a, TXS2a, . . . , and TXSya through the plurality of second electrodes 220.

In an embodiment, each of the plurality of first transmission signals TXS1, TXS2, . . . , and TXSx and the plurality of second transmission signals TXS1a, TXS2a, . . . , and TXSya has a second voltage less than the first voltage. For example, the second voltage may be 3.3 V, but is not limited thereto.

In an embodiment, each of the plurality of first transmission signals TXS1, TXS2, . . . , and TXSx and the plurality of second transmission signals TXS1a, TXS2a, . . . , and TXSya has a second frequency less than the first frequency. For example, the second frequency may be 238 kHz, but is not limited thereto.

The sensor layer 200 may sense an input by the touch 2000 of the user body as the plurality of first electrodes 210 and the plurality of second electrodes 220 are integrated into one electrode. In this case, the sensor layer 200 operate in a self-touch manner.

When the user touch 2000 is sensed during the first touch duration TS1 and the second touch duration TS2 for each of the plurality of first frame durations FR2, FR3, and FR4, the main driving unit 1000 may determine that the electronic device 1000 is not placed in the pocket PK of the user (see FIG. 13 (S510).

When the user touch 2000 is not sensed during the first touch duration TS1 and the second touch duration TS2 of each of the plurality of first frame durations FR2, FR3, and FR4, the main driving unit 1000 may proceed to the step of sensing the proximity state of the user (S410).

When the step of sensing the proximity of the user (S410) is performed, the sensor driving unit 200C may drive the sensor layer 200 in the proximity sensing mode MDb. In the proximity sensing mode MDb, the sensor driving unit 200C may operate with a plurality of first frame durations FR5, and FR6 each having a second operating frequency. In an embodiment, the second operating frequency is different from the first operating frequency for each of a plurality of first frame durations FR2, FR3, and FR4. In other words, the report rate of the frame duration in the proximity sensing mode MDb may be different from the report rate of the frame duration in the touch sensing mode MDa. In an embodiment, the second operating frequency is less than the first operating frequency.

Although FIG. 15 illustrates two second frame durations FR5 and FR6 in the proximity sensing mode MDb, the present disclosure is not limited thereto. For example, the number of frame durations may be provided differently depending on the time of operating in the proximity sensing mode MDa.

Each of the plurality of second frame durations FR5 and FR6 may include a first proximity sensing duration AS1. The first proximity sensing duration AS1 may be operated in a self-capacitance manner or a mutual-capacitance manner.

In an embodiment, a third width W3 of the first proximity sensing duration AS1 is greater than the first width W1 of the first touch duration TS1. In an embodiment, the third width W3 is greater than the second width W2 of the second touch duration TS2. In other words, the time when the first proximity sensing duration AS1 is provided may be longer than the time when the first touch duration TS1 and the second touch duration TS2 are provided.

Figure 16C:
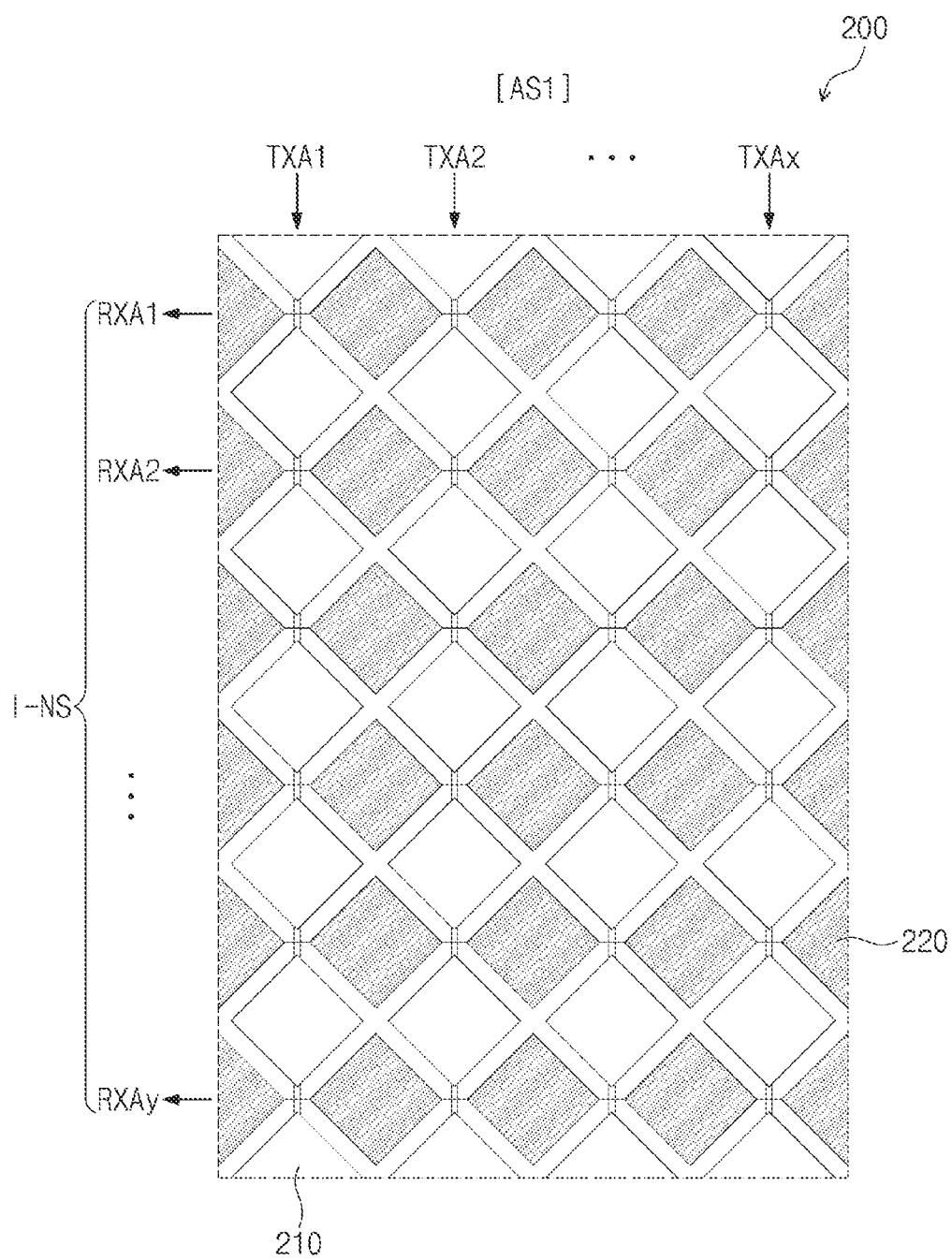

Referring to FIG. 16C, in the first proximity sensing duration AS1, the sensor driving unit 200C may output a plurality of first transmission signals TXA1, TXA2, ..., and TXAx to the plurality of first electrodes 210, and may receive a plurality of second sensing signals RXA1, RXA2, ..., and RXAy through the plurality of second electrodes 220. The sensor driving unit 200C may output a plurality of sensing signals RXA1, RXA2 to RXAy to the main driving unit 1000C (see FIG. 2). In other words, the proximity sensing signal I-NS may include the second sensing signals RXA1, RXA2 to RXAy.

The plurality of transmission signals TXA1, TXA2, and TXAx may be simultaneously output to the plurality of first electrodes 210. For example, the number of the plurality of transmission signals TXA1, TXA2, ..., and TXAx, which are simultaneously output, may be larger than the number of the plurality of transmission signals TXM1, TXM2 to TXMx (see FIG. 16A) which are simultaneously output, for the first touch duration TS1. For example, the number of the plurality of transmission signals TXA1, TXA2, ..., and TXAx, which are simultaneously output, may be '18', and the number of the plurality of transmission signals TXM1, TXM2 to TXMx (see FIG. 16A) which are simultaneously output, may be '1' or '4'.

According to an embodiment of the present disclosure, the plurality of transmission signals TXA1, TXA2, ..., and TXAx may be provided to some of the plurality of first electrodes 210, and remaining first electrodes 210 may be omitted. For example, the plurality of transmission signals TXA1, TXA2, ..., and TXAx is provided to a first set of the first electrodes 210 and no transmission signal is provided to a second other set of the first electrodes 210. The sensor driving unit 200C may receive the proximity sensing signal I-NS by outputting a transmission signal to some of the first electrodes 210, instead of all first electrodes 210, because only the sensing state of the large-area conductor 3000 is needed instead of accurate coordinates of the large-area conductor 3000. Accordingly, the power consumption of the sensor driving unit 200C may be reduced.

In an embodiment, the plurality of transmission signals TXA1, TXA2 to TXAx are in phase with one another, which are different from the plurality of transmission signals TXM1, TXM2 to TXMx (see FIG. 16A) that have the same waveforms. In another embodiment, the plurality of transmission signals TXA1, TXA2 to TXAx are out of phase with one another.

Each of the plurality of transmission signals TXA1, TXA2, ..., and TXMx may have a third voltage. In an embodiment, the third voltage is greater than the first voltage and the second voltage. For example, the third voltage may be 9 V, but is not limited thereto.

Each of the plurality of transmission signals TXA1, TXA2, ..., and TXAx may have a third frequency. In an embodiment, the third frequency is less than the first frequency and the second frequency. For example, the third frequency may be 54 kHz, but is not limited thereto.

According to present disclosure, as the strength of a signal for detecting an object close to the electronic device 1000 is increased, an electric field for sensing the large-area conductor 3000 may be formed stronger as compared to the first touch duration TS1 of the second touch duration TS2. A signal-to-noise ratio of the second sensing signals RXA1, RXA2, ..., and RXAy may be increased. The recognition distance (or object recognizable height) of the proximity sensing may be increased. Accordingly, the electronic device 1000 (refer to FIG. 1) having increased reliability may be provided.

Figure 16D:
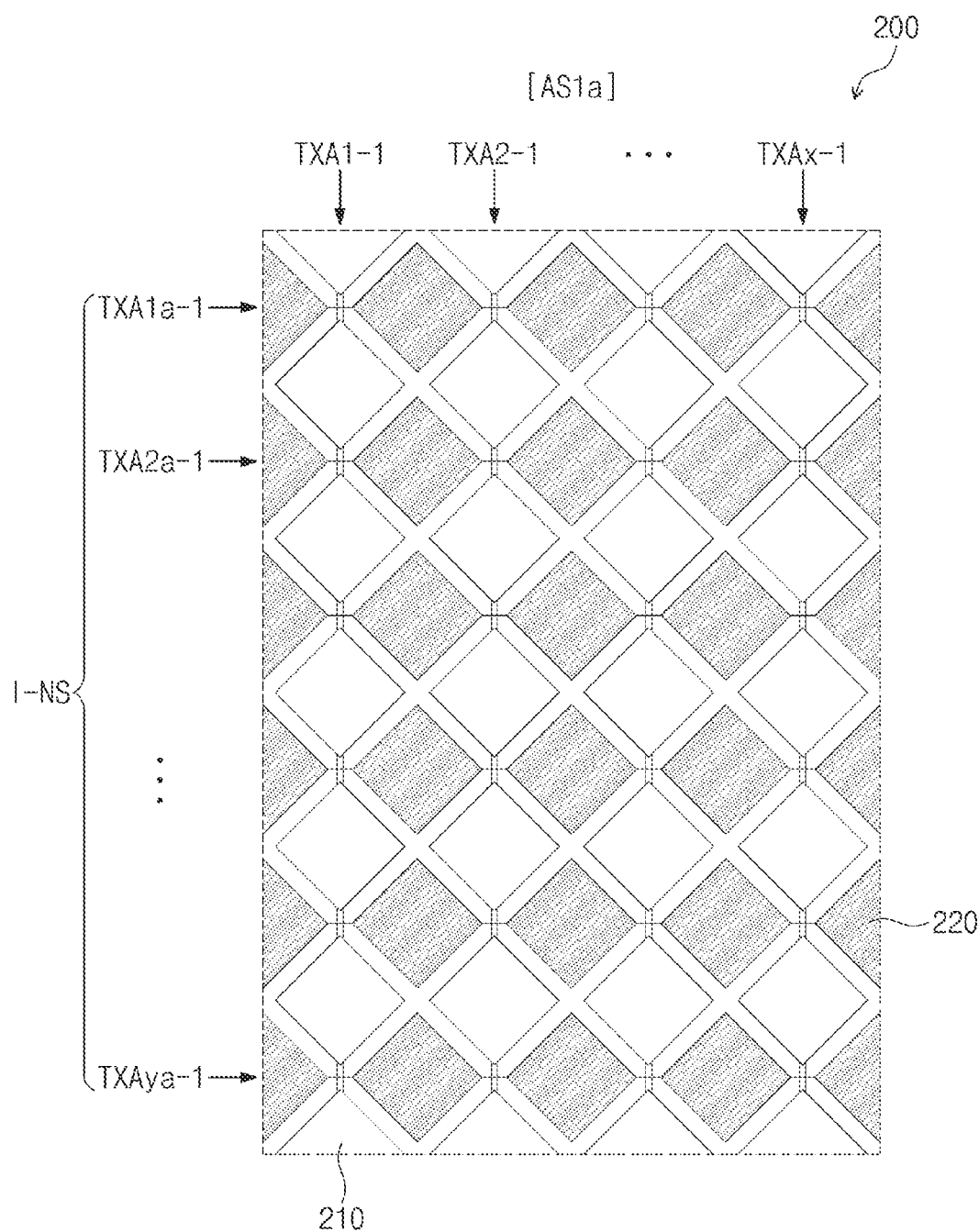

FIG. 16D illustrates a case in which a first proximity sensing duration AS1a is measured in a self-capacitance scheme. Referring to FIG. 16D, for the first proximity sensing duration AS1a, the sensor driving unit 200C may output a plurality of first transmission signals TXA1-1, TXA2-1 ..., and TXAx-1 to the plurality of first electrodes 210, and may receive the plurality of second transmission signals TXA1a-1, TXA2a-1, ..., and TXAya-1 from the plurality of second electrodes 220. For example, the second transmission signals TXA1a-1, TXA2a-1, ..., and TXAya-1 may be received in response to the first transmission signals TXA1-1, TXA2-1, ..., and TXAx-1.

Each of the plurality of first transmission signals TXA1-1, TXA2-1, ..., and TXAx-1 and the plurality of second transmission signals TXA1a-1, TXA2a-2, ..., and TXAya-1 may have a fourth voltage. In an embodiment, the fourth voltage is greater than the second voltage. In an embodiment, the fourth voltage is less than the third voltage. For example, the fourth voltage may be 6 V, but is not limited thereto.

Each of the plurality of first transmission signals TXA1-1, TXA2-1, ..., and TXAx-1 and the plurality of second transmission signals TXA1a-1, TXA2a-2, ..., and TXAya-1 may have a fourth frequency. In an embodiment, the fourth frequency is less than the second frequency. In an embodiment, the fourth frequency is greater than the third frequency. For example, the fourth frequency may be 85 kHz, but is not limited thereto.

The sensor layer 200 may sense an input of a user for the large-area conductor 3000, when the plurality of first electrodes 210 and the plurality of second electrodes 220 are integrated into one electrode.

In an embodiment, a first time for providing the plurality of first transmission signals TXA1-1, TXA2-1, . . . , and TXAx-1 and the plurality of second transmission signals TXAla-1, TXA2a-2, . . . , and TXAya-1 is longer than a second time for providing the plurality of first transmission signals TXS1, TXS2, . . . , and TXSx, and the plurality of second transmission signals TXSla, TXS2a, . . . , and TXSya. For example, the first time may be 10 milliseconds (ms), and the second time may be 1 ms.

According to an embodiment of the present disclosure, as the strength of a signal for detecting an object close to the electronic device 1000 is increased, an electric field for sensing the large-area conductor 3000 may be formed stronger, as compared to the second touch duration TS2. The recognition distance (or object recognizable height) of the proximity sensing may be increased. Accordingly, the electronic device 1000 (refer to FIG. 1) having increased reliability may be provided.

Referring further to FIG. 17, when the display surface of the electronic device 1000 in the pocket PK faces the large-area conductor 3000, an electric field for sensing the large-area conductor 3000 may be formed to pass through the user clothes 4000 and to form a capacitance Cp together with the large-area conductor 3000. For example, the large-area conductor 3000 may be a chest or a thigh of a user depending on the position of the pocket PK. When the sensor layer 200 senses the large-area conductor 3000 in the proximity sensing mode MDb, the electronic device 1000 may be determined as being placed in the pocket PK of the user.

The sensor layer 200 may sense a proximity state of the large-area conductor 3000 during the first proximity sensing duration AS1.

When the large-area conductor 3000 is not sensed during the first proximity sensing duration AS1 of the plurality of second frame durations FR5 and FR6, the main driving unit 1000C may determine that the electronic device 1000 is not placed in the pocket PK of the user (see FIG. 13) (S510).

When the large-area conductor 3000 is sensed during the first proximity sensing duration AS1 of each of the plurality of second frame durations FR5 and FR6, the main driving unit 1000C may determine a first reason for the placement of the electronic device 1000 in the pocket PK of the user (see FIG. 13) (S520). For example, the main driving unit 1000C may generate first sensing information when the large-area conductor 3000 is sensed during the first proximity sensing duration AS1 of each of the plurality of second frame durations FR5 and FR6 that indicates the electronic device 1000 is located within the pocket PK of the user.

According to the present disclosure, the main driving unit 1000C may determine whether the electronic device 1000 is placed in the pocket PK of the user (see FIG. 13,) based on the information sensed by the sensor layer 200. When it is determined, based on the sensitivity of the capacitance for the plurality of second electrodes 220, that the temperature of the sensor layer 200 is high, the user touch 2000 is not sensed in the sensor layer 200, and a physical part of the user body, which is a large-area conductor 3000, is sensed, the main driving unit 1000C may determine the first reason for the placement of the electronic device 1000 in the pocket PK of the user (see FIG. 13) (S520). The first reason or the first sensing information may be used to determine the placement of the electronic device 1000 in the pocket PK of the user (see FIG. 13), together with other reasons (or other sensing information) received by the main driving unit 1000C. Accordingly, the electronic device 1000 (refer to FIG. 1) having increased reliability may be provided.

In other words, according to an embodiment of the present disclosure, the main driving unit 1000C may determine the first reason for the placement of the electronic device 1000 in the pocket PK of the user (see FIG. 13) (S520), by totally determining the temperature using the sensor layer 200, the touch 2000, and the large-area conductor 3000. The main driving unit 1000C may easily determine whether the electronic device 1000 is placed in the pocket PK of the user (see FIG. 13). Accordingly, the electronic device 1000 (refer to FIG. 1) having increased reliability may be provided.

Figure 18:
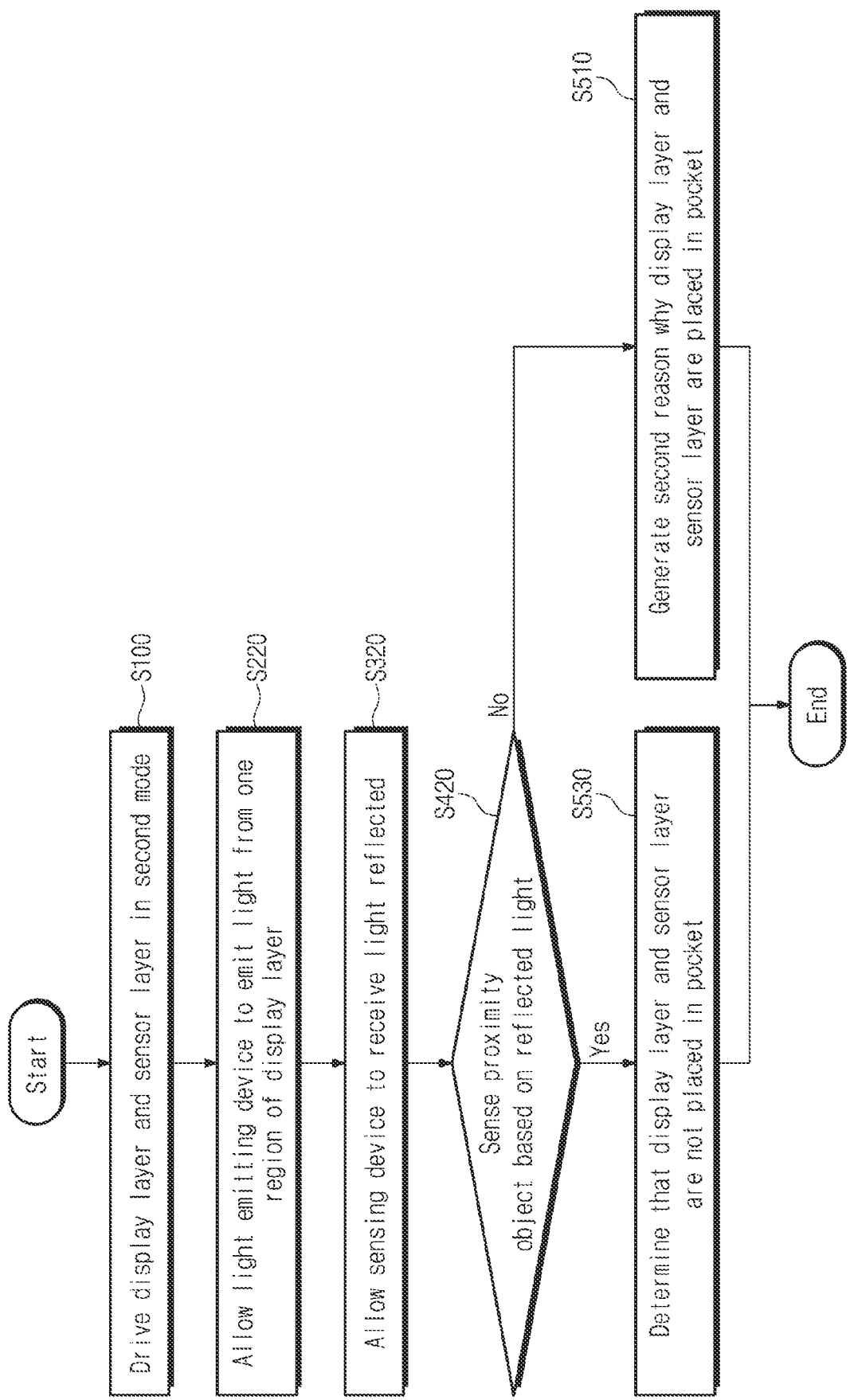
FIG. 18 is a flowchart illustrating a method for driving an electronic device according to an embodiment of the present disclosure.
Figure 19A:
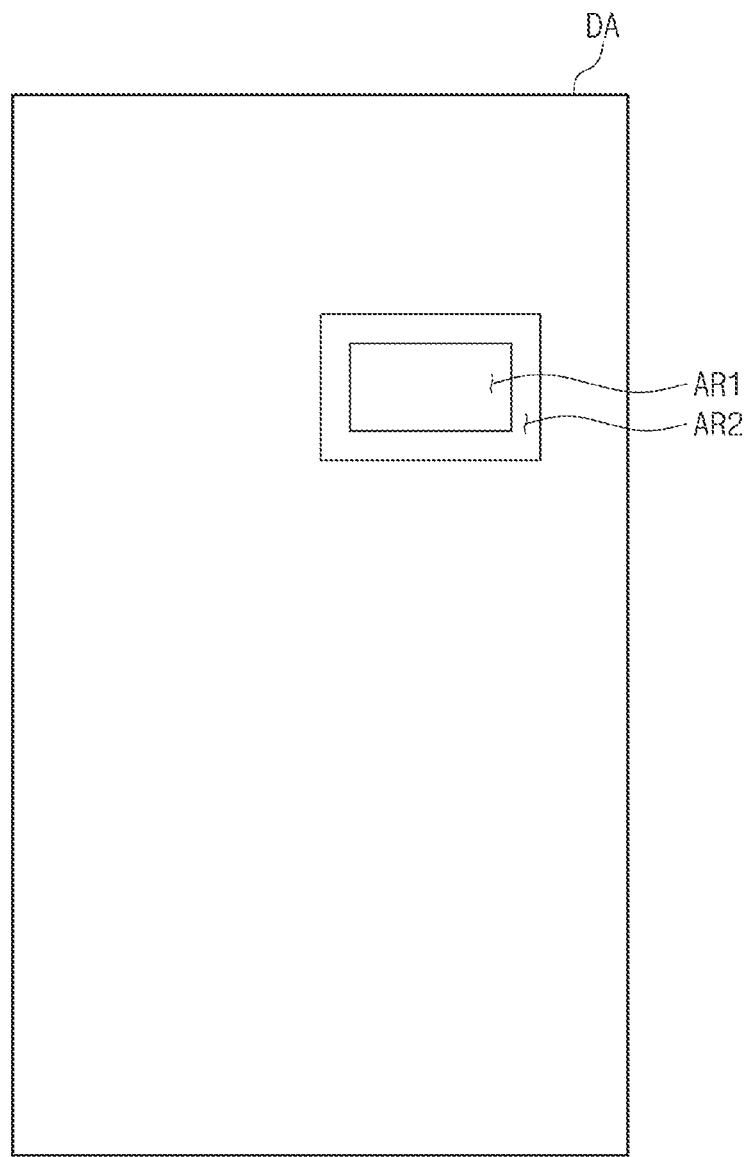
FIG. 19A is a plan view illustrating an active region of a display layer according to an embodiment of the present disclosure.
Figure 19B:
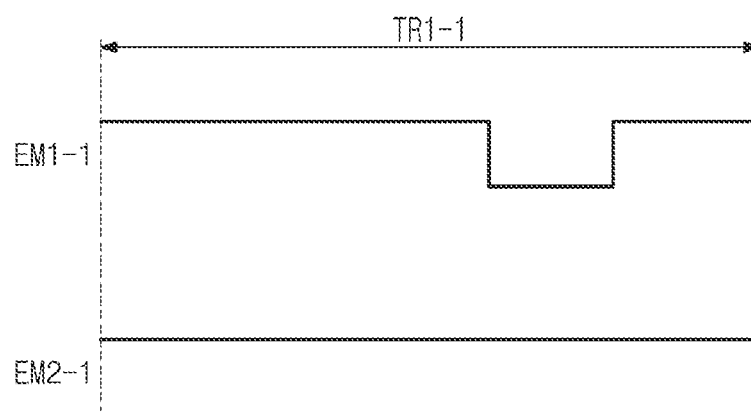
FIG. 19B illustrates a waveform of a light emitting control signal according to an embodiment of the present disclosure.

FIG. 18 is a flowchart illustrating a method for driving an electronic device according to an embodiment of the present disclosure. FIG. 19A is a plan view illustrating an active region of a display layer according to an embodiment of the present disclosure, and FIG. 19B illustrates a waveform of a light emitting control signal according to an embodiment of the present disclosure. In the following description made with reference to FIG. 18, the components that are described with reference to FIG. 12 are assigned with the same reference numerals, and the details thereof will be omitted.

Referring to FIGS. 2, 13, 18, and 19B, the electronic device 1000 may be placed in the pocket PK of the user. In this case, the main driving unit 1000C (see FIG. 2) may be switched from the first mode MD1 (see FIG. 15), which is an existing mode, to operate in the second mode MD2 (see FIG. 15) for determining whether the electronic device 1000 is placed in the pocket PK (S100). For example, display layer 100 and the sensor layer 200 may be driven in the second mode MD2.

When the electronic device 1000 is placed in the pocket PK of the user, the electronic device 1000 may be placed in clothes 4000 of the user.

A first region AR1 and a second region AR2 may be defined in the active region DA. The first region AR1 may be a region of the active region DA. The second region AR2 may be a region adjacent to the first region AR1 and surrounding the first region AR1.

The display driving unit 100C may emit light through the light emitting elements OLED (see FIG. 6) disposed in the first region AR1. In other words, the light emitting element OLED (see FIG. 6) may emit light from one region of the display layer 100 (S220). The operation may be referred to as the step of emitting light. In an embodiment, the light is emitted only from the one region and not from any other region of the display layer 100.

A first light emitting control signal EM1-1 may be provided to light emitting control lines EML1 to EMLn (see FIG. 4) connected to pixels PX (see FIG. 4) disposed in the first region AR1 during the frame duration F1-1 of the step of emitting light. In an embodiment, the first light emitting control signal EM1-1 is not provided to the light emitting control lines connected to the pixels outside the one region.

The first light emitting control signal EM1-1 may be in an active level. The active level of the first light emitting control signal EM1-1 may be in a low level. In other words, the pixels PX (see FIG. 4) disposed in the first region AR1 may be turned on to emit light with specific brightness.

The specific brightness of the display layer 100 in the first region AR1 may be higher than or equal to a brightness when the display layer 100 displays an image. For example, the specific brightness may be the maximum brightness of the display layer 100.

Whenever the step of emitting light proceeds, the position of the first region AR1 in the active region DA may be changed to a position different from a previous position. When light is emitted from the light emitting element OLED (see FIG. 6) by fixing the position of the first region AR1, which is different from the present disclosure, the light emitting element OLED (see FIG. 6) may be degraded, as the light emitting element OLED emits light with the maximum brightness. Accordingly, the image quality of the display layer 100 may deteriorate. However, according to the present disclosure, the display driving unit 100C changes the position of the first region AR1, at every driving in the second mode (S100). Accordingly, the electronic device 1000 (refer to FIG. 1) having increased reliability may be provided.

A second light emitting control signal EM2-1 may be provided to light emitting control lines EML1 to EMLn (see FIG. 4) connected to pixels PX (see FIG. 4) disposed in the second region AR2 during the frame duration F1-1 of the step of emitting light. In an embodiment, the second light emitting control signal EM2-1 has a waveform different from a waveform of the first light emitting control signal EM1-1.

The second light emitting control signal EM2-1 may be in an inactive level. The active level of the second light emitting control signal EM2-1 may be in a higher level. In other words, the pixels PX (see FIG. 4) disposed in the second region AR2 may not emit light.

The plurality of sensors FX (see FIG. 4) disposed in the first region AR1 and the second region AR2 may receive light which is obtained by reflecting light emitted from the light emitting element OLED (see FIG. 6) in the first region AR1 (S320). For example, the plurality of sensors FX disposed in the first region AR1 and the second region AR2 may receive reflected light based on light emitted from the light emitting element OLED.

The main driving unit 1000C may sense a proximity object based on the reflection light (S420). The details thereof will be described later.

Figure 19C:
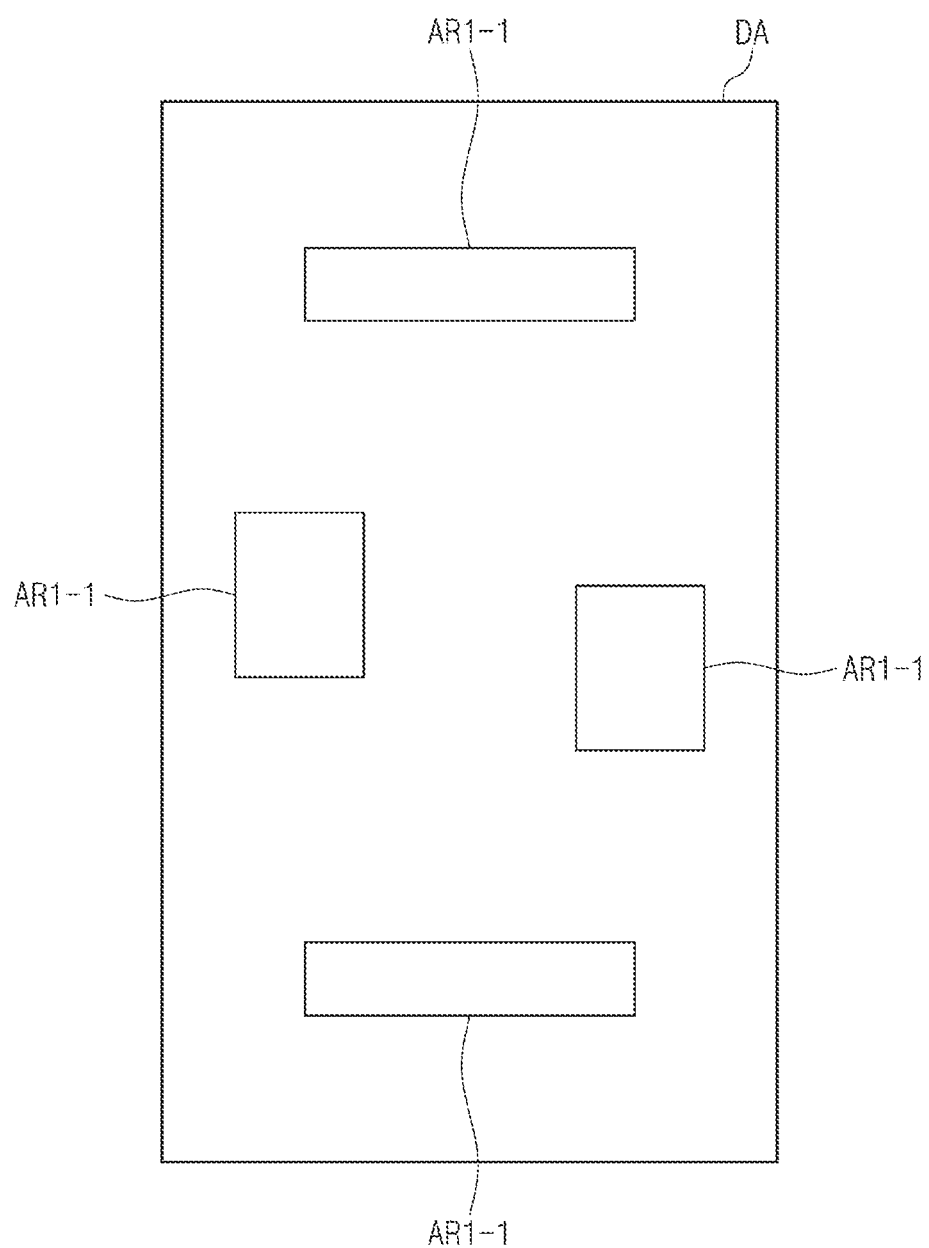
FIG. 19C is a plan view illustrating an active region of a display layer according to an embodiment of the present disclosure.

FIG. 19C is a plan view illustrating an active region of a display layer according to an embodiment of the present disclosure.

Referring to FIG. 19C, a plurality of first regions AR1-1 may be provided. A plurality of first regions AR1-1 may be spaced apart from each other and defined in the active region DA.

The display driving unit 100C (see FIG. 2) may emit light through the light emitting elements OLED (see FIG. 6) disposed in the first regions AR1-1. In embodiment, light is emitted only through the first regions AR1-1 and the regions outside the first region AR1-1 do not emit light.

According to an embodiment of the present disclosure, the second region AR2 (see FIG. 19A) may be omitted.

A plurality of sensors FX (see FIG. 4) disposed in the plurality of first regions AR1-1 may receive light reflected from the light emitting element OLED (see FIG. 6) in the plurality of first regions AR1-1. The main driving unit 1000C may combine information collected in the plurality of first regions AR1-1 and use the combination of the information for determining whether the electronic device 1000 is placed in the pocket PK (see FIG. 13).

Figure 20:
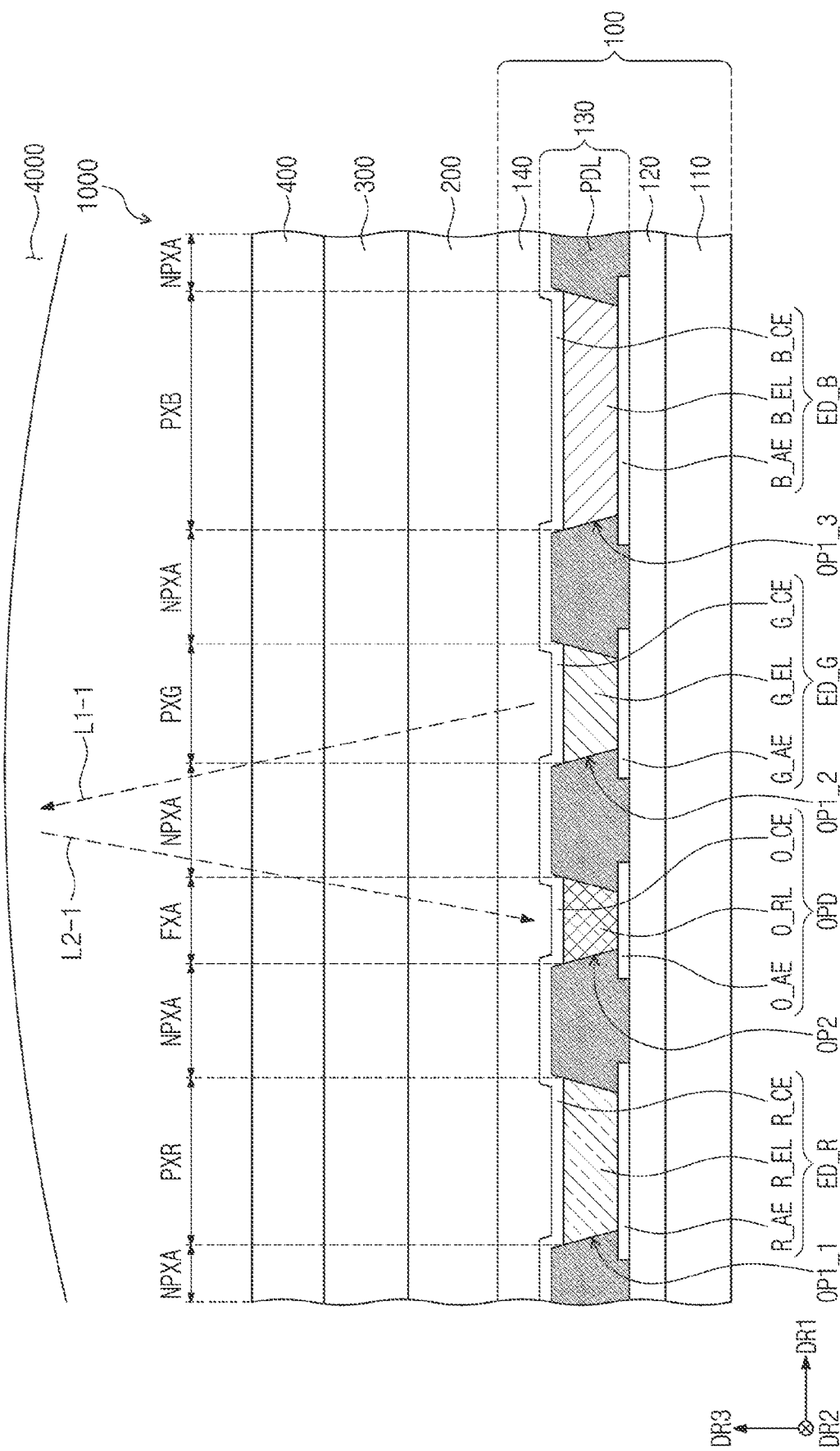
FIG. 20 is a cross-sectional view of an electronic device according to an embodiment of the present disclosure.

FIG. 20 is a cross-sectional view of an electronic device according to an embodiment of the present disclosure. In the following description made with reference to FIG. 20, the components that are described with reference to FIG. 8 are assigned with the same reference numerals, and the details thereof will be omitted.

Referring to FIGS. 2, 18, and 20, at least one of the first to third light emitting elements ED_R, ED_G, and ED_B may output the first light L1-1.

The sensing element OPD may receive a second light L2-1 obtained by reflecting a first light L1-1 from the first to third light emitting elements ED_R, ED_G, and ED_B. In other words, the sensing element OPD may receive the second light L2-2 obtained by reflecting the first light L1-1, which is output from at least one of the first to third light emitting elements ED_R, ED_G, and ED_B, from an object 4000. The object 4000 may include clothes of a user. For example, the first light L1-1 may be reflected off a surface of the object 400 to generate the second light L2-2.

According to the present disclosure, the first light L1-1 may be provided toward the object 4000 during a second time. The second time may be shorter than the first time when the light L1 (see FIG. 8) is provided toward the biometric information FG (see FIG. 8). For example, the second time may be 50 ms. The main driving unit 1000C need only make a determination regarding the presence of the object 4000 at a proximity position, based on an amount of light received. Accordingly, the main driving unit 1000C may determine the amount of light received, based on the first light L1-1 provided for a shorter time. Accordingly, the power consumption of the main driving unit 1000C may be reduced.

In addition, according to the present disclosure, the main driving unit 1000C may perform a process of sensing the object 4000 based on the second light L2-1. The process may be simpler as compared to the process of generating an image including biometric information FG (see FIG. 8). The main driving unit 1000C need only make a determination regarding the presence of the object 4000 at a proximity position, based on an amount of light received instead of an image. Accordingly, the main driving unit 1000C may detect the object 4000 by simply processing the image. Accordingly, the power consumption of the main driving unit 1000C may be reduced.

The sensing signal SC transmitted by the display driving unit 100C to the main driving unit 1000C may include an amount of the second light L2-1 which is received. For example, the amount may be determined from the sensing signal SC.

The main driving unit 1000C may determine whether the electronic device 1000 is placed in the pocket PK of the user (see FIG. 13) based on an amount of the second light L2-1 which is received.

When it is determined, based on the amount of the second light L2-1 received, that the object is absent at a proximity position, the main driving unit 1000C may determine that the electronic device 1000 is not placed in the pocket PK of the user (see FIG. 13) (S510). In other words, when it is determined, based on an amount of a received light reflected from the sensor FX (see FIG. 4) of the display layer 100, that the object is not present at a proximity position, the main driving unit 1000C may determine that the electronic device 1000 is not placed in the pocket PK of the user (see FIG. 13) (S510).

The main driving unit 1000C may determine a second reason for the placement of the electronic device 1000 in the pocket PK of the user (see FIG. 13) (S530), when sensing the object at a proximity position, based on an amount of the second light L2-1 received.

According to the present disclosure, the main driving unit 1000C may determine whether the electronic device 1000 is placed in the pocket PK (see FIG. 13) based on the information sensed in the display layer 100. The main driving unit 1000C may determine the second reason for the placement of the electronic device 1000 in the pocket PK of the user (see FIG. 13) (S530), when sensing the object 4000 at a proximity position in the display layer 100, based on the reflection light received in the plurality of sensors FX (see FIG. 4). For example, the electronic device 1000 may determine second sensing information when sensing the object 4000 at a proximity position in the display layer 100, based on the reflection light received in the plurality of sensors FX. The second reason or the second sensing information may be used to determine the placement of the electronic device 1000 in the pocket PK of the user (see FIG. 13), together with other reasons (or other sensing information) received by the main driving unit 1000C. Accordingly, the electronic device 1000 (refer to FIG. 1) having increased reliability may be provided.

When it is determined, based on the sensitivity of the capacitance for the plurality of second electrodes 220, that the temperature of the sensor layer 200 is high, the user touch 2000 is not sensed in the sensor layer 200, and a part of a physical body of the user body, which is a large-area conductor 3000, is sensed, the main driving unit 1000C may determine the first reason for the placement of the electronic device 1000 in the pocket PK of the user (see FIG. 13) (S520).

The main driving unit 1000C may determine the second reason for the placement of the electronic device 1000 in the pocket PK of the user (see FIG. 13) (S530), when sensing the object 4000 at a proximity position in the display layer 100, based on the reflection light received in the plurality of sensors FX (see FIG. 4).

The main driving unit 1000C may determine whether the electronic device 1000 is placed in the pocket PK (see FIG. 13), by considering the first reason (or first sensing information) determined or generated based on the coordinate signal I-SS and the proximity sensing signal I-NS sensed in the sensor layer 200, and the second reason (or second sensing information) determined or generated based on the sensing signal SC sensed in the display layer 100.

According to an embodiment of the present disclosure, the main driving unit 1000C may make the determination by applying a weight to each of the first reason (or first sensing information) and the second reason (or second sensing information), depending on the situation. For example, when the display surface of the electronic device 1000 faces the large-area conductor 3000, in the pocket PK, the main driving unit 1000C may determine or generate the first reason (S520). However, when the display surface of the electronic device 1000 faces a direction opposite to the direction of the large-area conductor 3000, in the pocket PK (see FIG. 13), the capacitance Cp (see FIG. 17) is not formed, and the first reason (or first sensing information) is not determined or generated. However, according to an embodiment the present disclosure, the main driving unit 1000C may determine whether the electronic device 1000 is placed in the pocket PK (see FIG. 13), by applying a weight to the second reason (or the second sensing information) determined or generated by the display layer 100, and may determine the electronic device 1000 as being placed in the pocket PK of the user, based on the second reason (S530). Accordingly, the electronic device 1000 may prevent an unnecessary operation such as the operation of turning on the display layer 100. Accordingly, the electronic device 1000 (refer to FIG. 1) reduced in power consumption and having increased reliability may be provided.

The step of determining whether the temperature of the sensor layer 200 is a lower temperature (S210), the step of detecting the touch 2000 of the user (S310) and the step of sensing proximity of the user (S410) may be performed independently of the step of sensing the object 4000, which is closer, based on light reflected from the display layer 100. However, this is provided merely for illustrative purpose.

For example, according to an embodiment of the present disclosure, the step of determining whether the temperature of the sensor layer 200 is a lower temperature (S210), the step of detecting the touch 2000 of the user (S310) and the step of sensing proximity of the user (S410) may be performed simultaneously with the step of sensing the object 4000, which is closer, based on light reflected from the display layer 100.

The main driving unit 1000C may further receive, from other sensors, the reason that the electronic device 1000 is placed in the pocket PK (see FIG. 13) or third sensing information. For example, the main driving unit 1000C may receive a third reason or the third sensing information from a gesture sensor. For example, the gesture sensor may read and interpret movements of objects. The third reason may be information making the determination that the electronic device 1000 is placed in the pocket PK (see FIG. 13), when the information is not received from the gesture sensor. For example, it could be concluded that the electronic device is in the pocket PK if the gesture sensor is unable to observe movement of the electronic device 1000 for a certain amount of time.

The step of determining whether the electronic device 1000 is placed in the pocket PK (see FIG. 13) of the user may include the step of determining whether the electronic device 1000 is placed in the pocket PK (see FIG. 13) of the user, by using the first reason sensed in the sensor layer 200 (or the first sensing information), the second reason sensed in the display layer 100 (or the second sensing information), and the third reason sensed from the gesture sensor (or the third sensing information).

As described above, the main driving unit may determine whether the electronic device is placed in the pocket, by considering the first reason or the first sensing information determined or generated based on the coordinate signal and the proximity sensing signal sensed in the sensor layer, and the second reason or the second sensing information determined or generated based on the sensing signal sensed in the display layer.

Although exemplary embodiments of the present disclosure have been described for illustrative purposes, those skilled in the art will appreciate that various modifications, and substitutions are possible, without departing from the scope and spirit of the inventive concept.

What is claimed is:

1. An electronic device comprising:
   a display layer including a plurality of pixels within an active region to display an image and a sensor, each of the plurality of pixels including a pixel driving circuit and a light emitting element, and the sensor including a sensor driving circuit and a plurality of sensing elements;
   a sensor layer disposed on the display layer, and including a plurality of first electrodes and a plurality of second electrodes;
   a display driving circuit configured to control the pixels and the sensor;
   a sensor driving circuit configured to control the sensor layer; and
   a main driving circuit configured to control the display driving circuit and the sensor driving unit and to operate in a first mode,
   wherein, in the first mode,
   the display driving circuit controls the light emitting elements disposed in a first region of the active region to emit a first light and the light emitting elements disposed in a second region of the active region surrounding the first region to not emit any light and operates the sensor to generate a proximity sensing signal, the display driving circuit receives a second light reflected based on the first light, through the sensing elements disposed in the first region and the second region without considering the sensing elements of the active region that surrounds the second region, and the main driving circuit determines whether the display layer and the sensor layer are placed in a pocket of a user, based on an amount of the second light and the proximity sensing signal.

2. The electronic device of claim 1, wherein in the first mode, the sensor driving circuit operates the sensor layer in one of a touch sensing mode and a proximity sensing mode,
wherein the sensor driving circuit operates for a plurality of first frame durations having a first operating frequency, in the touch sensing mode, and
wherein each of the plurality of first frame durations includes:
a first touch duration for sensing a user touch in a mutual touch manner; and
a second touch duration for sensing the user touch in a self-touch manner.

3. The electronic device of claim 2, wherein in the proximity sensing mode, the sensor driving circuit operates the sensor layer for a plurality of second frame durations having a second operating frequency different from the first operating frequency, and
wherein each of the plurality of second frame durations includes a proximity sensing duration for sensing a proximity state of a conductor.

4. The electronic device of claim 3, wherein a width of the proximity sensing duration is greater than a width of the first touch duration and a width of the second touch duration.

5. The electronic device of claim 3, wherein a voltage of a sensing signal provided to the plurality of first electrodes for the proximity sensing duration is higher than a voltage of the sensing signal provided to the plurality of first electrodes for the first touch duration.

6. The electronic device of claim 3, wherein a voltage of a sensing signal provided to the plurality of first electrodes for the proximity sensing duration is higher than a voltage of the sensing signal provided to the plurality of first electrodes for the second touch duration.

7. The electronic device of claim 3, wherein the main driving circuit determines whether the display layer and the sensor layer are placed in the pocket of the user, based on a sensing value sensed during the proximity sensing duration.

8. The electronic device of claim 1, further comprising:
a memory including a first characteristic of a capacitance measured in the sensor layer at a first temperature and a second characteristic of a capacitance measured in the sensor layer at a second temperature higher than the first temperature,
wherein the main driving circuit determines that the display layer and the sensor layer are not placed in the pocket of the user, when the capacitance measured in the sensor layer corresponds to the first characteristic.

9. The electronic device of claim 8, wherein a first slope of a graph illustrating sensitivity of the capacitance to each of the plurality of second electrodes in the first characteristic is greater than a second slope of a graph illustrating the sensitivity of the capacitance to the each of the plurality of second electrodes in the second characteristic.

10. The electronic device of claim 9, wherein the main driving circuit determines that the display layer and the sensor layer are not placed in the pocket of the user, when a slope of the graph illustrating the sensitivity of the capacitance to each of the plurality of second electrodes in the sensor layer is greater than the first slope.

11. The electronic device of claim 1, wherein the pixel driving circuit includes a light emitting control line,
wherein the display driving circuit outputs a light emitting control signal to the light emitting control line, and
wherein a waveform of the light emitting control signal provided to a pixel disposed in the first region is different from the waveform of the light emitting control signal provided to a pixel disposed in the second region.

12. The electronic device of claim 1, wherein the sensor comprises a plurality of sensors disposed in the active region.

13. The electronic device of claim 1, wherein a brightness of the display layer in the first region is higher than a brightness when the display layer displays the image.

14. The electronic device of claim 1, wherein the main driving circuit operates the display driving circuit and the sensor driving unit in the first mode for each of a plurality of frame durations, and changes a position of the first region to a different position in each of the plurality of frame durations.

15. A method for driving an electronic device, the method comprising:
driving, by a main driving circuit, a display layer including a plurality of pixels within an active region to display an image in a first mode and a sensor, each of the pixels including a pixel driving circuit and a light emitting element, the sensor including a sensor driving circuit and a plurality of sensing elements;
controlling the light emitting elements disposed in a first region of the active region to emit a first light and the light emitting elements disposed in a second region of the active region surrounding the first region to not emit any light and operating the sensor to generate a proximity sensing signal, in the first mode;
receiving a second light reflected based on the first light, through the sensing elements disposed in the first region and the second region without considering the sensing elements of the active region that surrounds the second region, in the first mode;
generating, by the main driving circuit, first sensing information when sensing an object close to the display layer based on the second light; and
determining whether the display layer and the sensor layer disposed on the display layer are placed in a pocket of a user based on the first sensing information and the proximity sensing signal.

16. The method of claim 15, wherein the sensor layer includes a plurality of first electrodes and a plurality of second electrodes,
wherein a first slope of a graph illustrating sensitivity of a capacitance for each of the plurality of second electrodes at a first temperature is greater than a second slope of a graph illustrating the sensitivity of the capacitance for each of the plurality of second electrodes at a second temperature higher than the first temperature, and the method further comprises:
determining that the display layer and the sensor layer are not placed in the pocket of the user, when a slope of the graph illustrating the sensitivity of the capacitance for each of the plurality of second electrodes in the sensor layer is greater than the second slope; and operating the sensor layer in a touch sensing mode, when the slope of the graph illustrating the sensitivity of the capacitance for each of the plurality of second electrodes in the sensor layer is less than the second slope.

17. The method of claim 16, wherein the operating of the sensor layer in the touch sensing mode comprises:

determining that the display layer and the sensor layer are not placed in the pocket of the user, when a touch of the user is sensed; and operating the sensor layer in a proximity sensing mode different from the touch sensing mode, when the touch is not sensed.

18. The method of claim 17, wherein in the touch sensing mode, the sensor layer is operated for a plurality of first frame durations having a first operating frequency, and wherein each of the plurality of first frame durations includes:

a first touch duration for sensing the touch of the user in a mutual touch manner; and a second touch duration for sensing the touch in a self-touch manner.

19. The method of claim 18, wherein the operating of the sensor layer in the proximity sensing mode comprises:

determining that the display layer and the sensor layer are not placed in the pocket of the user, when a conductor is not sensed; and generating second sensor information indicating why the display layer and the sensor layer are placed in the pocket of the user, when the conductor is sensed.

20. The method of claim 19, wherein, in the proximity sensing mode, the sensor layer is operated for a plurality of second frame durations having a second operating frequency different from the first operating frequency, and each of the plurality of second frame durations includes a proximity sensing duration for sensing a proximity state of the conductor.

21. The method of claim 19, wherein the determining of whether the display layer and the sensor layer are placed in the pocket of the user further:

determining that the display layer and the sensor layer are disposed in the pocket of the user, by using the first sensing information and the second sensing information.

22. The method of claim 15, further comprising changing a position of the first region to a different position and then re-performing the controlling, the receiving, the generating, and the determining.

* * * * *